(12) United States Patent
Naka et al.

(10) Patent No.: US 7,710,521 B2
(45) Date of Patent: May 4, 2010

(54) LCD DEVICE INCLUDING A REFLECTION FILM HAVING A CONVEX-CONCAVE SURFACE

(75) Inventors: Kenichirou Naka, Kanagawa (JP); Michiaki Sakamoto, Kanagawa (JP); Hiroshi Nagai, Kanagawa (JP); Kenichi Mori, Kanagawa (JP)

(73) Assignee: NEC LCD Technologies, Ltd, Kanagawa (JP)

( * ) Notice: Subject to any disclaimer, the term of this patent is extended or adjusted under 35 U.S.C. 154(b) by 134 days.

(21) Appl. No.: 12/014,528

(22) Filed: Jan. 15, 2008

(65) Prior Publication Data

US 2008/0170189 A1 Jul. 17, 2008

(30) Foreign Application Priority Data

Jan. 17, 2007 (JP) ............................. 2007-008498

(51) Int. Cl.
*G02F 1/1335* (2006.01)
(52) U.S. Cl. ..................................................... 349/113
(58) Field of Classification Search ...................... None
See application file for complete search history.

(56) References Cited

U.S. PATENT DOCUMENTS

| 6,914,656 B2 * | 7/2005 | Sakamoto et al. ............ 349/141 |
| 2002/0051107 A1 * | 5/2002 | Nagayama et al. .......... 349/113 |
| 2004/0070710 A1 * | 4/2004 | Yoshii ........................ 349/113 |

FOREIGN PATENT DOCUMENTS

| JP | 2003-344837 A | 12/2003 |
| JP | 2005-338256 A | 12/2005 |
| JP | 2006-180200 A | 7/2006 |

* cited by examiner

*Primary Examiner*—Omar Rojas
(74) *Attorney, Agent, or Firm*—Sughrue Mion, PLLC

(57) ABSTRACT

An LCD device includes a reflective area in each pixel. A reflection film having a convex-concave surface is provided in the reflective area, film in cross section configuration is formed. Each pixel includes a pixel electrode and a common electrode for applying a lateral electric field on a LC layer. The inclination angle of the reflection film has an inclination angle distribution, wherein the angle component in an area corresponding to the electrodes has a lower angle distribution than the angle components in an area corresponding to a gap between adjacent two of the electrodes.

4 Claims, 22 Drawing Sheets

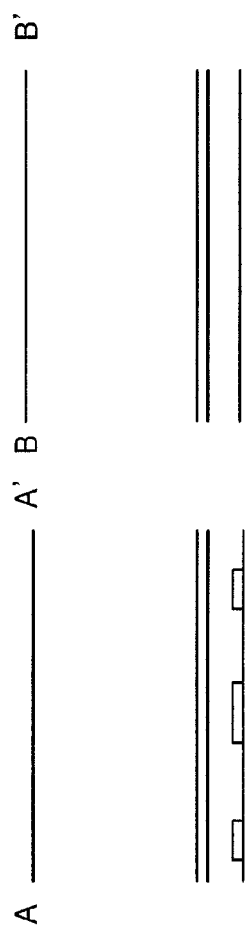
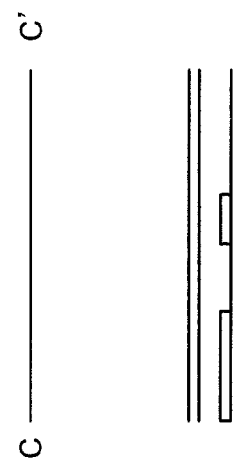
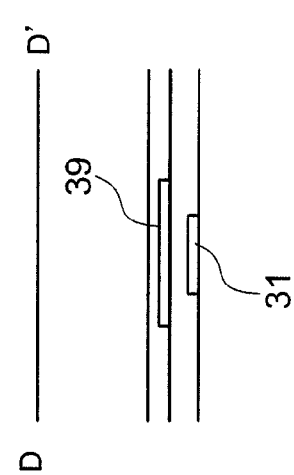
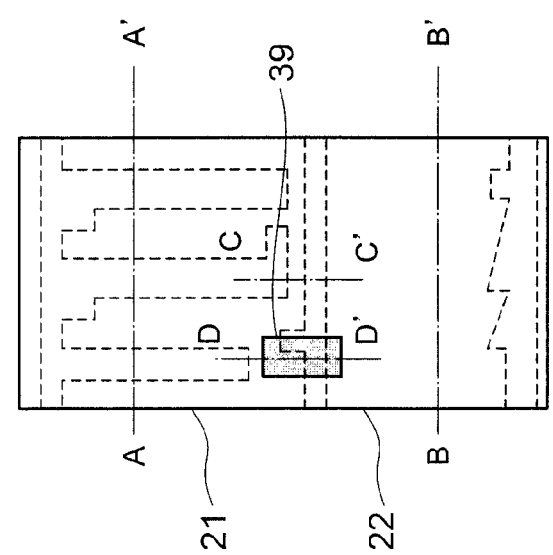
FIG. 11A
FIG. 11B
FIG. 11C
FIG. 11D
FIG. 11

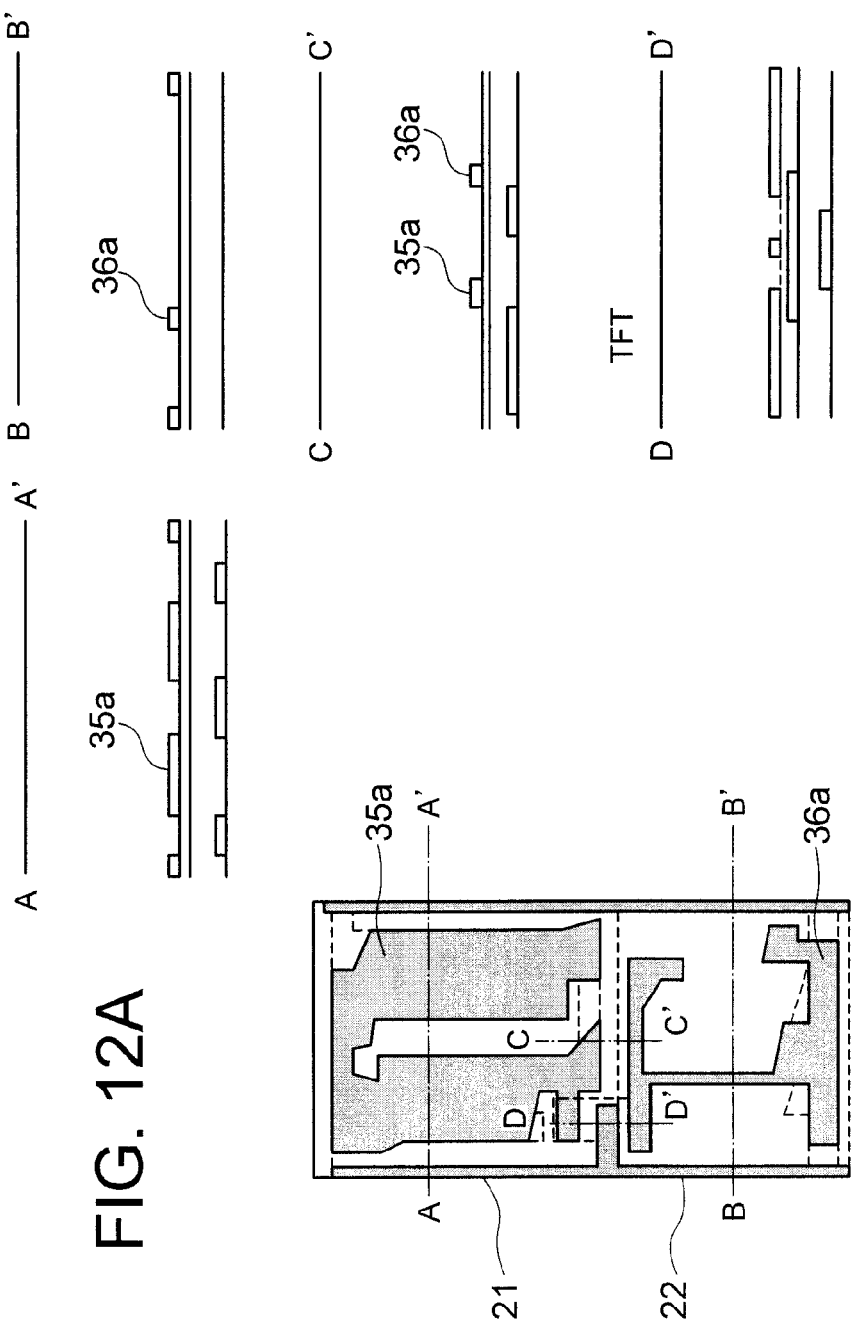

FIG. 13B
FIG. 13C
FIG. 13D
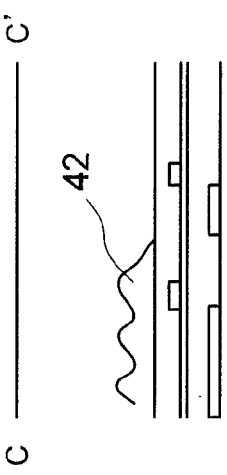
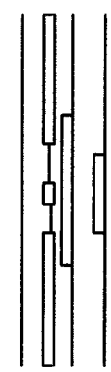
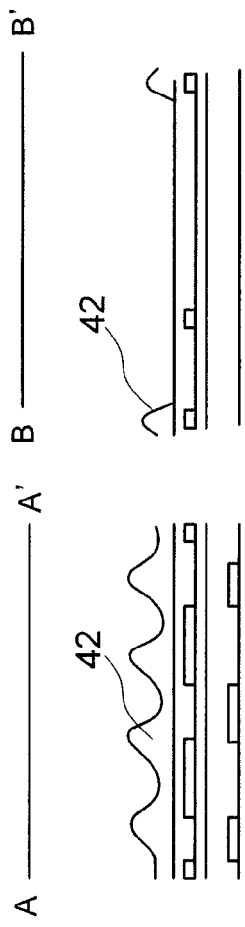
FIG. 13A
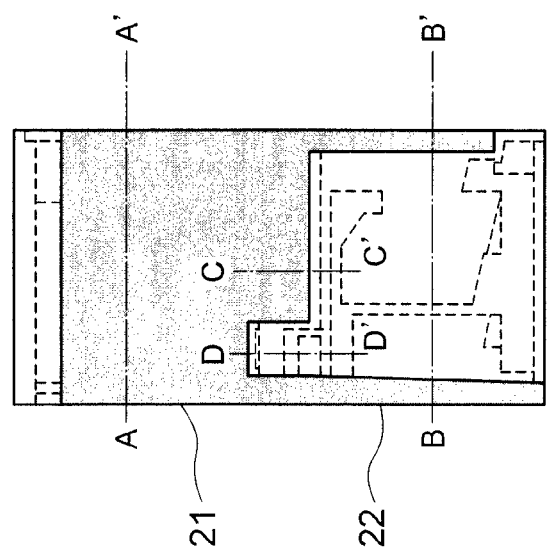
FIG. 13

FIG. 14A
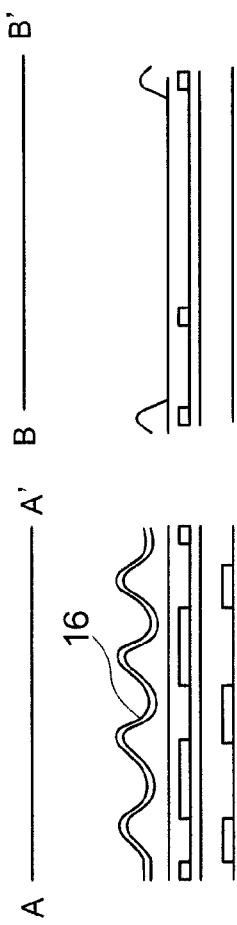
FIG. 14B
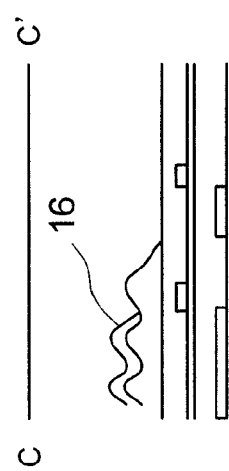
FIG. 14C
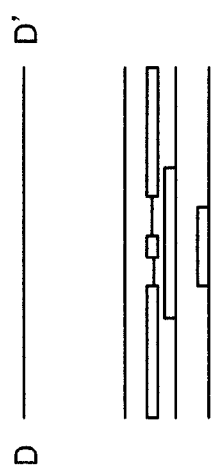
FIG. 14D
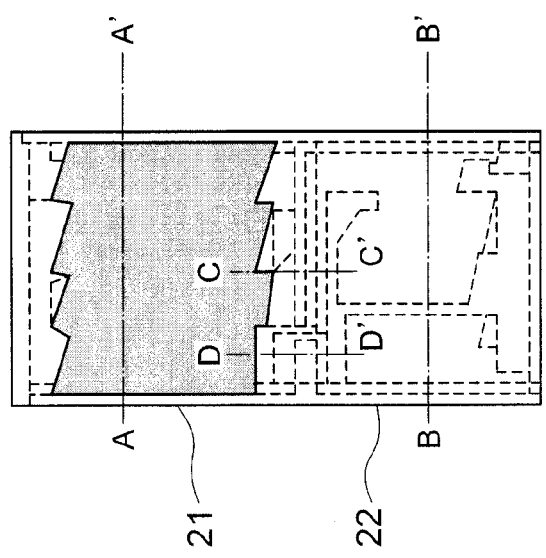
FIG. 14

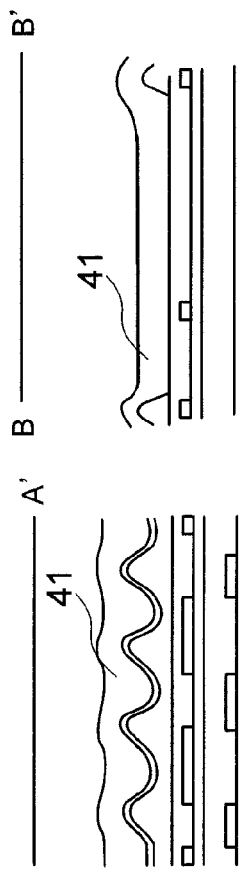
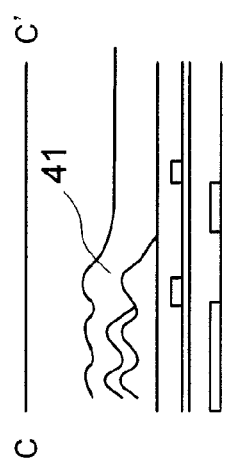
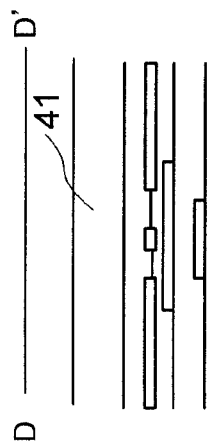
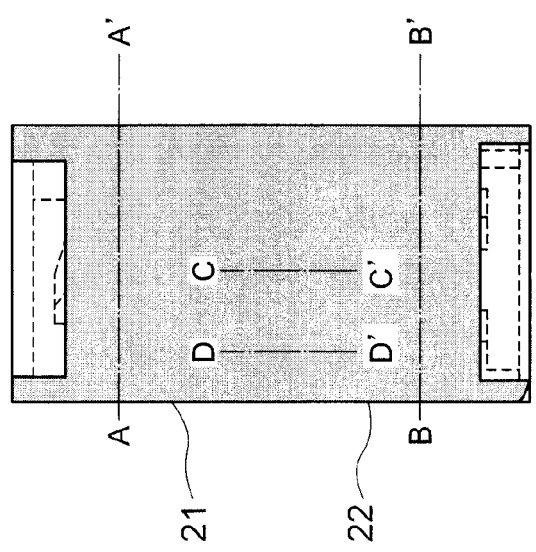

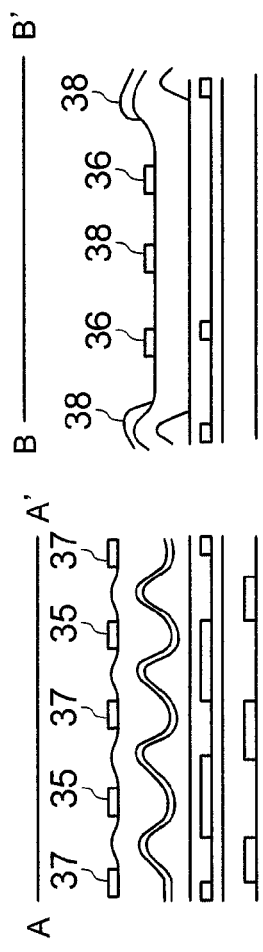
FIG. 17B
FIG. 17C
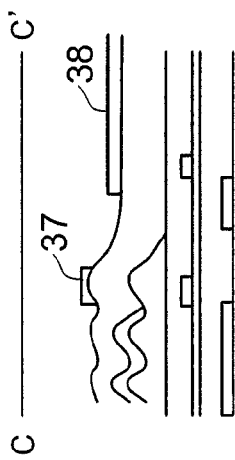
FIG. 17A
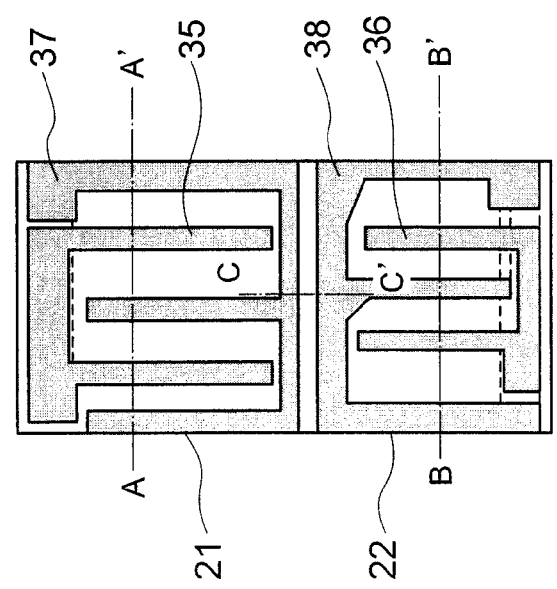
FIG. 17

FIG. 18A
FIG. 18B
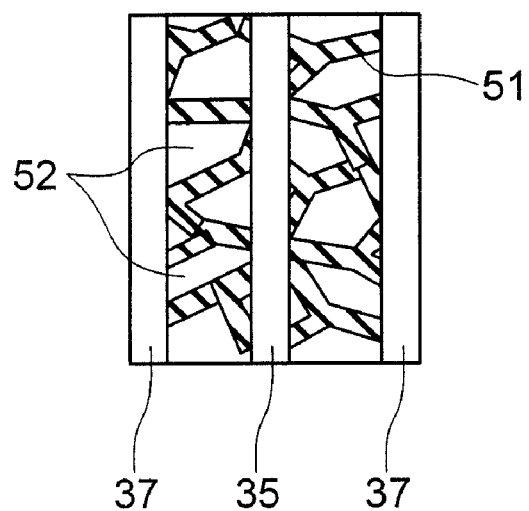
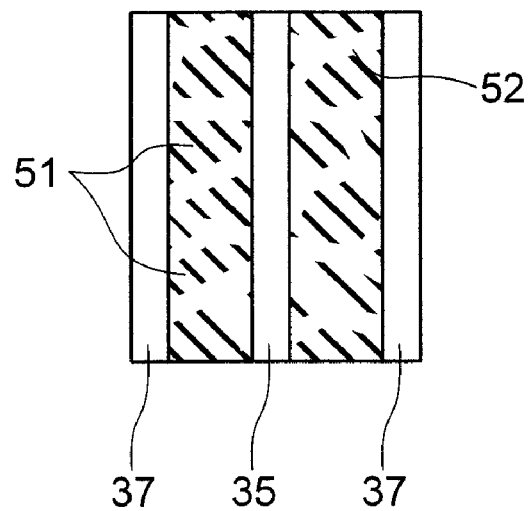

FIG. 26A
FIG. 26B
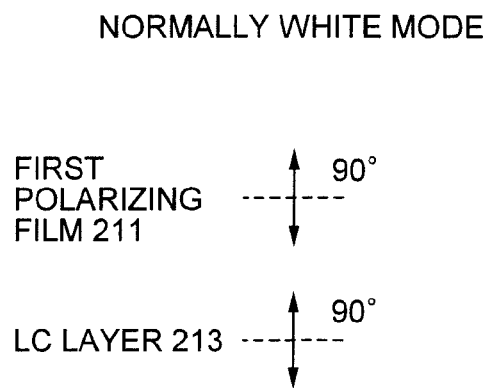
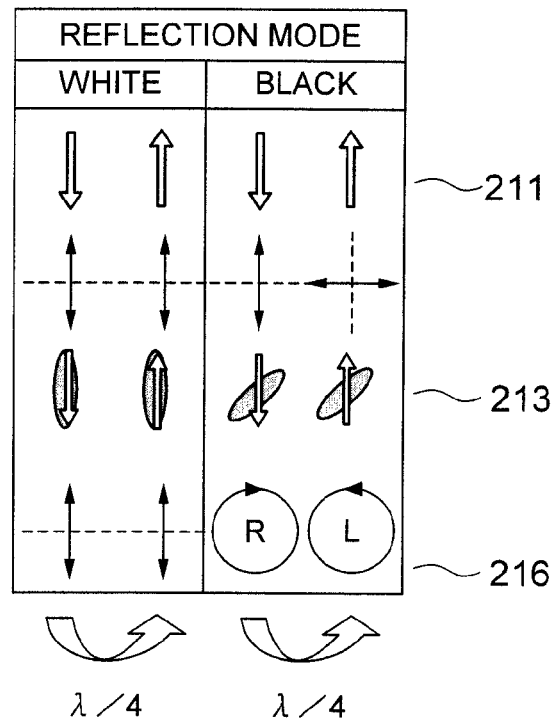

NORMALLY BLACK MODE

LCD DEVICE INCLUDING A REFLECTION FILM HAVING A CONVEX-CONCAVE SURFACE

This application is based upon and claims the benefit of priority from Japanese patent application No. 2007-008498, the disclosure of which is incorporated herein in its entirety by reference.

BACKGROUND OF THE INVENTION

1. Field of the Invention

This invention relates to an LCD device, and more particularly, to an LCD device of the reflective type or transflective type of the lateral-electric-field drive mode.

2. Description of the Related Art

Conventionally, there have been suggested LCD devices of reflective type or transflective type in which a pixel electrode and a common electrode are formed on the same substrate, as in an IPS mode or FFS mode, and LC molecules are switched using a lateral electric field generated between the pixel electrode and the common electrode to thereby display an image on the screen. For example, in Patent Publications JP-2003-344837A1, JP-2005-338256A1, there have been described transflective type lateral-electric-field drive modes using a reflection mode as a normally black mode under which absence of applied voltage on the LC layer represents a dart state or black. Furthermore, in JP-2006-180200A, there has been described a transflective type lateral-electric-field drive mode using a reflection mode as a normally white mode under which absence of applied voltage on the LC layer represents a bright state or white.

Hereinafter, a transflective type LCD device of the lateral-electric-field drive mode described in JP-2003-344837A1 will be described. FIG. 25 shows a schematic sectional view indicative of an LCD device described in this publication. The LCD device 200 includes a pair of substrates including TFT substrate 214 and counter substrate 212, which oppose each other, an LC layer 213 which is sandwiched between the TFT substrate 214 and the counter substrate 212, and polarizing films 211, 215 which are attached to the external surfaces of the TFT substrate 214 and counter substrate 212, respectively, far from the LC layer 213. Between the LC layer 213 and the polarizing film 215, a half-wave ($\lambda/2$) plate 218 is inserted. In FIG. 25, the LCD device 200 has a backlight unit (not shown) that irradiates backlight to the LC layer 213 through the polarizing film 215. Furthermore, on the surface of the TFT substrate 214 and counter substrate 212 near the LC layer 213, a horizontal orientation film (not shown) is formed. The angle formed between the orientation directions of the two horizontal orientation films represents a twist angle of the LC layer 213.

The LCD device 200 includes in each pixel a transmissive area 222 that allows the light incident from the backlight unit to transmit from the polarizing film 215 toward the polarizing film 211, to thereby display an image on the screen, and a reflective area 221 that reflects the light incident from the outside through the polarizing film 211 and reflected by a reflection film 216, to thereby display an image on the screen. A first insulating film 217 is formed on the surface of the TFT substrate 214 near the LC layer 213. In the reflective area 221, a second insulating film 242 is formed on the first insulating film 217, and the reflection film 216 is formed thereon. On the reflection film 216, a third insulating film 241 is formed, and on the third insulating film 241, lateral-electric-field drive electrodes including pixel electrode 235 and common electrode 237 are formed. On the other hand, in the transmissive area 222, lateral-electric-field drive electrodes including pixel electrode 236 and common electrode 238 are formed on the first insulating film 217 arranged on the TFT substrate 214.

In the reflective area 221, the pixel electrode 235 and common electrode 237 extend parallel to each other, and the LC layer 213 is driven by a lateral electric field generated between the pixel electrode 235 and the common electrode 237. In the transmissive area 222 either, the pixel electrode 236 and common electrode 238 extend parallel to each other, and the LC layer 213 is driven by a lateral electric field generated between the pixel electrode 236 and the common electrode 238. The second insulating film 242 and third insulating film 241 adjust the difference between the LC cell gap of the reflective area 221 and the LC cell gap of the transmissive area 222. Specifically, when the gap of the LC layer 213 in the transmissive area 222 is set to ½ wavelength ($\lambda/2$) of light, the gap of the LC layer 213 in the reflective area 221 is adjusted to ¼ wavelength.

FIG. 26A shows the polarizing axis direction of the polarizing film 211 and the LC orientation direction in the LC layer 213 of the above-described LCD device, and FIG. 26B shows the polarized state of light in the reflective area 221. It is defined, as shown in FIG. 26A, that the polarizing axis of the polarizing film 211 and the LC orientation direction in the LC layer 213 is at 90 degrees. In this notation, as shown in FIG. 26A, upon absence of applied voltage on the LC layer, a 90-degree-linearly polarized light passed by the polarizing film 211 directly passes through the LC layer 213, and is reflected by the reflection film 216 with its polarized state being kept linearly polarized. The reflected linearly polarized light directly passes through the LC layer 213, and passes by the polarizing film 211, whereby the image on the screen assumes a bright state or white. Upon presence of applied voltage on the LC layer, the oriented angle of the LC layer 213 assumes 45 degrees, and the linearly polarized light passed by the polarizing film 211 passes through the LC layer 213 to assume clockwise-circularly polarized light, which is reflected by the reflection film 216 to assume counterclockwise-circularly polarized light to pass through the LC layer 213, and advances toward the polarizing film 211, as a 0-degree-linearly polarized light. Accordingly, the light is blocked by the polarizing film 211, whereby the image on the screen represents a dark state or white, resulting in a normally white mode.

FIG. 27A shows another example of the polarizing axis direction of the polarizing film 211 and the LC orientation direction in the LC layer 213 of the above-described LCD device, and FIG. 27B shows the polarized state of light in the reflective area 221. As shown in FIG. 27A, a case is considered in which the polarizing axis of the polarizing film 211 is set to 90 degrees, and the LC orientation direction in the LC layer 213 is set to 45 degrees. In this case, upon absence of applied voltage, the 90-degree-linearly polarized light passed by the polarizing film 211 passes through the LC layer 213 to assume a clockwise-circularly polarized light, which is reflected by the reflection film 216 to assume a counterclockwise-circularly polarized light. Since the counterclockwise-circularly polarized light passes through the LC layer 213 to assume a 0-degree-linearly polarized light, the light is blocked by the polarizing film 211, thereby representing a dark state or black. Upon presence of applied voltage, the oriented angle of the LC layer 213 assumes 0 degree, and the 90-degree-linearly polarized light passed by the polarizing film 211 passes through the LC layer 213 to be reflected by the reflection film 216 with the polarized angle being kept at 90 degrees. The reflected light from the reflection film 216 passes through the LC layer 213 with its polarized state being kept 90-degree-linearly polarized, and is emitted from the polarizing film 211, whereby the image on the screen represents a bright state or black, representing a normally black mode.

FIG. 28 shows the oriented state of LC molecules in the LCD device shown in FIG. 25 upon presence of applied voltage. Upon presence of applied voltage, a lateral electric field is generated between comb teeth electrodes, or between pixel electrode 235 and common electrode 237, and LC molecules in the LC layer 213 are oriented along the direction of the lateral electric field. However, since the lateral electric field is not applied to the LC layer 213 on the comb teeth electrodes, the LC molecules do not rotate thereon. More specifically, if the LCD device 200 is used as the normally white mode, the LC molecules on the comb teeth electrodes 235, 237 do not rotate. Therefore, the image on the electrodes 235, 237 stays "white" even when a voltage is applied to the LC layer, and the image assumes "black" only on the gap between the electrodes 235, 237, which raises a problem of lowering of the contrast ratio.

Specifically, when the configuration of a convex-concave surface of the reflection film 216 was uniform between the area overlapping the gap of electrodes and in the area overlapping the electrodes, even upon presence of applied voltage, the image on the electrodes stays bright, and the contrast ratio was 3:1 or lower at the maximum. With respect to the normally black mode, the LC molecules on the electrodes do not rotate similarly. Therefore, the image on the electrodes stayed "black" even when a voltage is applied to the LC layer, and the image assumed "white" only in the area overlapping the gap between the electrodes, which raises a problem of lowering the reflectance.

SUMMARY OF THE INVENTION

It is therefore an object of the present invention to solve the above problems to provide an LCD device of the reflective type or transflective type of the lateral-electric-field drive mode, which is capable of operating in a normally white mode while suppressing reduction of the contrast ratio and operating in a normally black mode while suppressing reduction in the reflectance.

It is another object of the present invention to provide a method for manufacturing the above LCD device, and a photomask to be used for forming a reflection film in the LCD device.

The present invention provides, in a first aspect thereof, a liquid crystal display (LCD) device including: a reflection area for reflecting incident light and provided in at least a part of a pixel; a reflection film provided in the reflection area and having a convex-concave surface; and a plurality of electrodes for driving therebetween liquid crystal (LC) molecules in a lateral direction, wherein: an inclination angle of the convex-concave surface has different components between a first area overlapping the electrodes and a second area overlapping a gap between adjacent two of the electrodes.

The present invention provides, in a second aspect thereof, a photomask for use in forming a liquid crystal ((LCD) device including a reflection area for reflecting incident light in at least a part of a pixel; a reflection film provided in the reflection area and having a convex-concave surface; and a plurality of electrodes for driving liquid crystal (LC) molecules in a lateral direction, wherein the photomask is used for forming the convex-concave surface on the reflection film, and has no convex-concave pattern in an area overlapping the electrodes.

The present invention provides, in a third aspect thereof, a photomask for use in forming a liquid crystal (LCD) device including a reflection area for reflecting incident light in at least a part of a pixel; a reflection film provided in the reflection area and having a convex-concave surface; and a plurality of electrodes for driving liquid crystal (LC) molecules in a lateral direction, wherein the photomask is used for forming the convex-concave surface on the reflection film, and includes a light shield pattern added in an area overlapping the electrodes.

The present invention provides, in a fourth aspect thereof, a photomask for use in forming a liquid crystal (LCD) device including a reflection area for reflecting incident light in at least a part of a pixel; a reflection film provided in the reflection area and having a convex-concave surface; and a plurality of electrodes for driving liquid crystal (LC) molecules in a lateral direction, wherein the photomask is used for forming the convex-concave surface on the reflection film, and includes a gray-tone pattern or a half-tone pattern in an area overlapping the electrodes.

The present invention provides, in a fifth aspect thereof, method of manufacturing an LCD device operating in a lateral-electric-field drive mode, the method including: coating photosensitive resin on a substrate; exposing the photosensitive resin by using a photomask according to the present invention; developing the exposed photosensitive resin; burning the developed photosensitive resin to form a convex-concave overcoat film; and forming a reflection film on the convex-concave overcoat film.

The above and other objects, features and advantages of the present invention will be more apparent from the following description, referring to the accompanying drawings.

BRIEF DESCRIPTION OF THE DRAWINGS

FIG. 11 and FIGS. 11A to 11D show a subsequent step subsequent to the step of FIG. 10 and FIGS. 10A to 10C, showing the subsequent step similarly thereto.

FIG. 12 and FIGS. 12A to 12D show a subsequent step subsequent to the step of FIG. 11 and FIGS. 11A to 11D, showing the subsequent step similarly thereto.

FIG. 13 and FIGS. 13A to 13D show a subsequent step subsequent to the step of FIG. 12 and FIGS. 12A to 12D, showing the subsequent step similarly thereto.

FIG. 14 and FIGS. 14A to 14D show a subsequent step subsequent to the step of FIG. 13 and FIGS. 13A to 13D, showing the subsequent step similarly thereto.

FIG. 15 and FIGS. 15A to 15D show a subsequent step subsequent to the step of FIG. 14 and FIGS. 14A to 14D, showing the subsequent step similarly thereto.

FIG. 17 and FIGS. 17A to 17C show a subsequent step subsequent to the step of FIG. 16 and FIG. 16E, showing the subsequent step similarly thereto.

FIGS. 18A and 18B each are a top plan view of the pattern of a photomask used to form a convex-concave film by using a polygon pattern;

FIG. 26A is a schematic view indicative of the definition of the direction for the polarizing axis of a polarizing film, LC orientation direction in the LC layer of an LCD device, and FIG. 26B is a schematic view of the polarized state of light in the reflective area;

DETAILED DESCRIPTION OF THE PREFERRED EMBODIMENTS

Figure 1A:
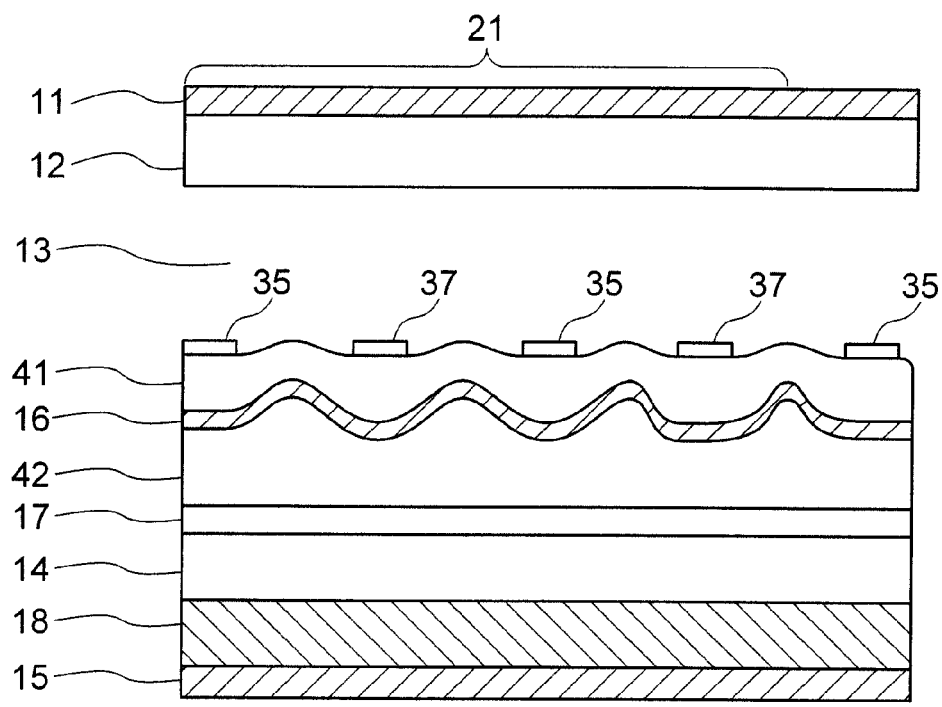
FIG. 1A is a sectional view of an LCD device according to a first embodiment of the present invention, showing the reflective area on the electrodes in a pixel.

Now, exemplary embodiments of the present invention will be described with reference to accompanying drawings, wherein similar constituent elements are designated by similar reference numerals.

Figure 25:
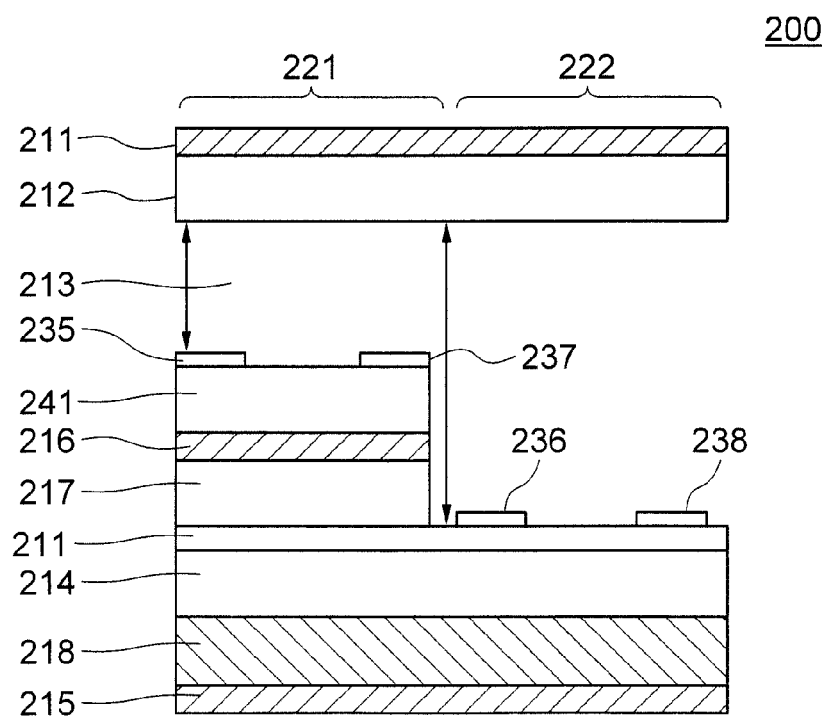
FIG. 25 is a sectional view indicative of an LCD device described in a patent publication.
Figure 27A:
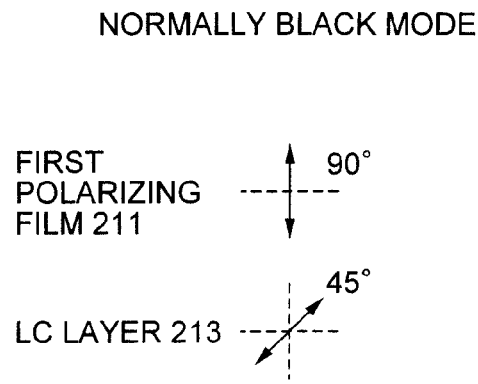
FIG. 27A is a schematic view indicative of the definition of the direction for the polarizing axis of a polarizing film, and another example of LC orientation direction in the LC layer of an LCD device.
Figure 27B:
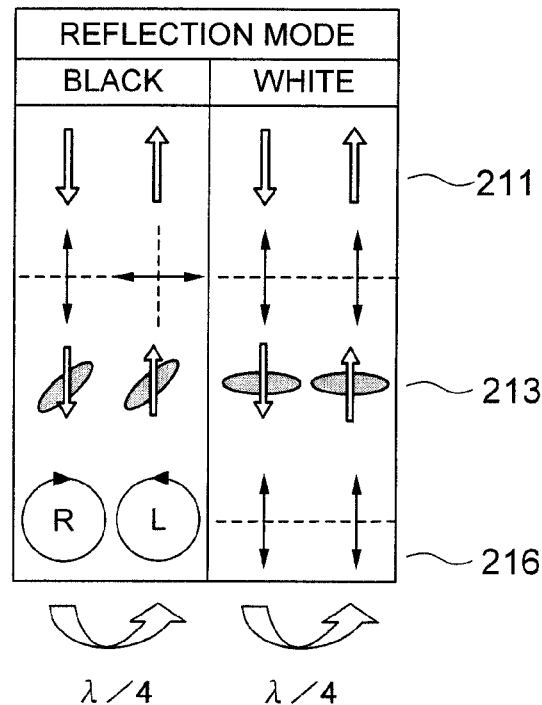
FIG. 27B is a schematic view of the polarized state of light in the reflective area.
Figure 28:
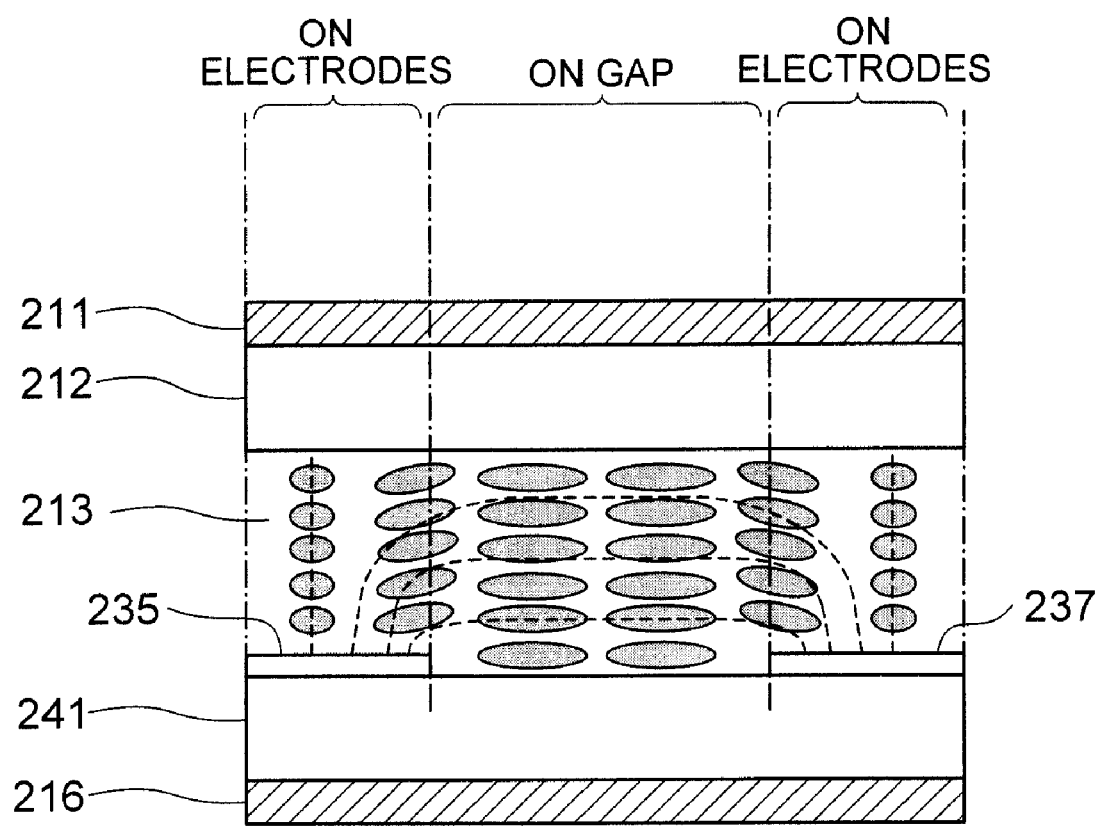
FIG. 28 is a sectional view indicative of the LC-oriented state in the LCD device shown in FIG. 25 upon presence of applied voltage.

FIG. 1A shows a schematic sectional view indicative of a pixel in an LCD device according to a first embodiment of the present invention. The LCD device 10 includes a first polarizing film 11, a counter substrate 12, an LC layer 13, a TFT substrate 14, a half-wave ($\lambda/2$) plate 18, and a second polarizing film 15, which are consecutively arranged from the front side of the LCD device, i.e., from a viewer side. Similar to the LCD device 200 shown in FIG. 25, the LCD device 10 is configured as a transflective type LCD device including a reflective area and a transmissive area in each pixel, and FIG. 1 shows the sectional configuration in the reflective area 21.

The polarization direction (light transmission direction or light absorption direction) of the first polarizing film 11 and the polarization direction of the second polarizing film 15 are perpendicular to each other. The LC layer 13 includes therein LC molecules which are arranged such that, upon absence of applied voltage, the longer axis direction of LC molecules is aligned with the polarization direction of the first polarizing film 11 or second polarizing film 15. In the following description, the definition of directions in the LCD device is such that the light transmission axis direction of the first polarizing film 11 is set to 90 degrees, the polarization direction of the second polarizing film 15 is set to 0 degree, and the longer axis direction of LC molecules in the LC layer 13 upon absence of applied voltage is set to 90 degrees.

In the reflective area 21 on the TFT substrate 14, a second insulating film 42 is formed on an insulating film 17, and a reflection film 16 is formed on the second insulating film 42. On the reflection film 16, a third insulating film 41 is formed. The reflection film 16 reflects the external light incident onto the LCD device through the first polarizing film 11 toward the first polarizing film 11. The reflective area 21 uses the light reflected by the reflection film 16 as a display light source. In general, to improve the scattering effect of light, the reflection film 16 is so formed as to have convex portions and concave portions thereon in the two-dimensional random arrangement. So as to realize the convex portions and concave portions on the reflection surface, there may be employed a configuration in which convex portions and concave portions are formed on the second insulating film 42, and a metal film made of Al, Ag or an alloy thereof is arranged on the thus formed convex portions and concave portions of the second insulating film 42 as a reflection film. The convex portions and concave portions may be formed by forming a two-dimensional array of convex surfaces. The LCD device 10 includes a backlight source or backlight unit, not shown, disposed behind the second polarizing film 15, and the transmissive area, not shown, uses the backlight source as a display light source.

The LC cell gap in the transmissive area is adjusted such that the retardation of the LC layer 13 assumes approximately $\lambda/2$. The expression of "approximately $\lambda/2$" is used because, in reality, the effective retardation assumes $\lambda/2$ when the retardation is set to $(\lambda/2)+\alpha$. This is because, upon presence of applied voltage on the LC layer 13 to rotate the longer axis of the LC molecules therein, the LC molecules rotate at the central part of the cell gap, while the rotation of the LC molecules is suppressed in the vicinity of the substrates. For example, in case the retardation of the LC layer 13 is set to $\Delta nd=300$ nm, the effective retardation upon presence of applied voltage thereto is set to $\Delta ndeff=\lambda/2=550/2=275$ nm. On the other hand, in the reflective area 21, by suitably setting the height of the insulating film 17, the cell gap is adjusted so that the effective retardation of the LC layer 13 upon presence of applied voltage thereto assumes $\lambda/4$.

On the third insulating film 41 and overlying the insulating film 17, there are formed pixel electrodes 35 to drive the LC molecules and common electrodes 37 to supply a reference potential. Furthermore, although not shown, pixel electrodes 35 and common electrodes 37 for driving the LC molecules in the transmissive area are formed on the TFT substrate 14, corresponding to the transmissive area. The common electrodes 37 have a portion extending in parallel with a gate line and another portion protruding from the first portion in the display area. The common electrode 37 is provided at a position opposing the pixel electrode 35 on the plane of the substrate surface. Furthermore, the common electrode in the transmissive area is formed at a position opposing the pixel electrode in the transmissive area on the plane of the substrate surface. To the common electrode of the respective areas, a drive signal is supplied having a predetermined waveform which is common to the respective pixels in the LCD device 10.

Figure 1B:
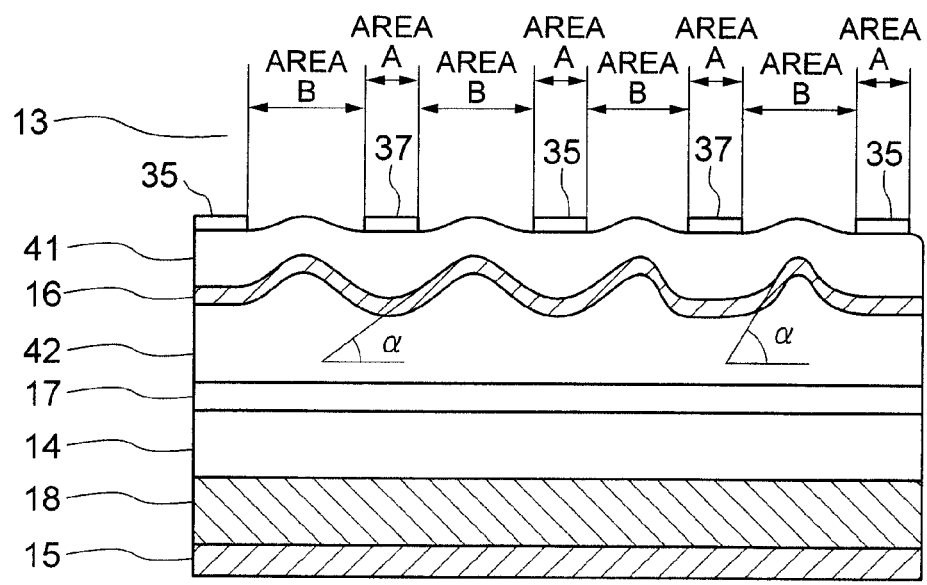
FIG. 1B is a partial sectional view of the LCD device of FIG. 1A, showing definition of the areas of the reflection film and the inclination angle of the convex-concave surface of the reflection film.

FIG. 1B shows the definition of the areas of the reflection film 16 and the inclination angle α of the convex-concave surface of the reflection film in this text. The reflection film 16 has a convex-concave surface thereon, which includes a plurality of areas A each of which overlaps one of the electrodes 35, 37 and a plurality of areas B each of which overlaps the gap between the pixel electrode 35 and the common electrode 37 disposed adjacent to each other. An inclination angle of the convex-concave surface can be measured between the tangential line of the convex portion of the convex-concave surface of the reflection film 16 and a plane parallel to the substrate surface. In this text, the inclination angle α in each area A or each area B is defined here by an average of the maximum inclination angles between the possible tangential lines of a convex portion in the each area and the substrate surface.

Figure 2:
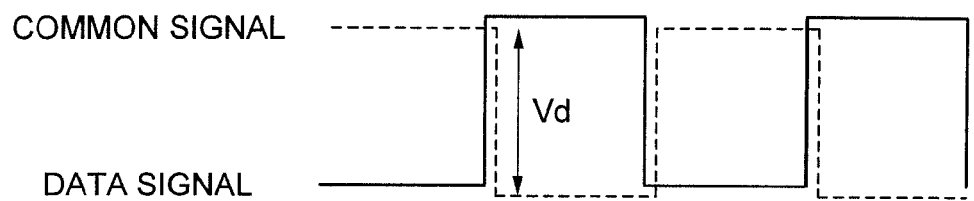
FIG. 2 is a timing chart indicative of the drive signal waveforms of the pixel electrode and the common electrode.

FIG. 2 shows the drive signal waveform supplied to the pixel electrode and common electrode. In FIG. 2, the data signal shown in solid line is supplied to the pixel electrodes 35 of respective pixels, and the common signal shown in the dotted line is supplied to the common electrodes 37. In this example, the phase of the data signal is opposite to the phase of the common signal, and the potential difference between the potential of the pixel electrode 35 and the potential of the common electrode 37 assumes Vd. Thus, an electric field having an intensity corresponding to the potential difference Vd is applied to the LC layer 13 in the reflective area 21.

Figure 3:
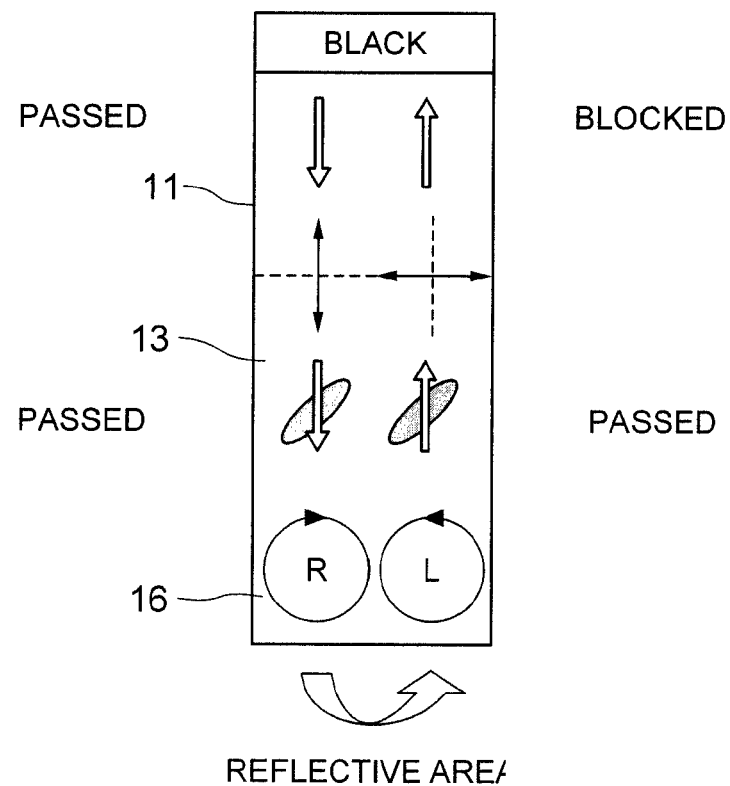
FIG. 3 is a schematic view of the polarized state of light in a reflective area.

FIG. 3 shows a schematic view indicative of the polarized state of light in the reflective area 21 when the signals having the waveform shown in FIG. 2 are applied to the electrodes therein. In the state in which the waveforms shown in FIG. 2 are applied, LC molecules of the LC layer 13 in the reflective area 21 have their aligned direction rotated by 45 degrees from the initial state due to the electric field generated between the pixel electrode 35 and common electrode 37.

As shown in FIG. 3, a 90-degree-linearly polarized light having a polarization in the longitudinal direction is passed by the first polarizing film 11 from the outside, and has its polarized state changed after passing through the LC layer 13 to assume clockwise-circularly polarized light. The clockwise-circularly polarized light is then reflected by the reflection film 16 to assume a counterclockwise-circularly polarized light, and the counterclockwise-circularly polarized light passes through the LC layer 13 again to assume 0-degree-linearly polarized light having a polarization in lateral direction. Accordingly, the reflected light from the reflection film 16 is blocked by the first polarizing film 11, and the image assumes a dark state or black in the reflective area 21.

Hereinafter, the results of investigation performed to solve the problems in the related LCD device of the reflective type or transflective type of the lateral-electric-field drive mode will be described. The problems included a problem that the reflection contrast ratio is lowered in the normally white mode, and a problem that the reflectance is lowered in the normally black mode. This investigation was intended to find what configuration of an irregular reflection film should have, if LC molecules on the comb teeth electrodes do not rotate sufficiently upon presence of applied voltage. As the configuration of the LCD device, the LCD device shown in FIG. 1 is considered. That is, there is considered an LCD device of the reflective type or transflective type of the lateral-electric-field drive mode which is similar to the LCD device described in JP-2003-344837A1 (shown in FIG. 25). In the LCD device shown in FIG. 1, the pixel includes a reflection film 16 having a convex-concave surface in a part or all the pixel area, the reflection film 16 being formed on a convex-concave overcoat (OC) film 42 such has having a plurality of convex portions arranged in a random two-dimensional array, and the pixel electrodes 35 and common electrodes 37 are formed into the comb teeth structure, which is formed on the convex-concave OC film 42 with an intervention of the reflection film 16 and an interlayer dielectric film 41.

As has been pointed out in the problems to be solved, the LC molecules on the comb teeth electrodes are not operated even upon presence of applied voltage in the lateral-electric-field drive mode. This leads to the problem that the light passed by the LC molecules on the comb teeth electrodes cause noise. In view of this fact, it is concluded that the reflected light of the light passing through the comb teeth electrodes is excluded from the viewing point of the viewer after is the reflection. That is, since the reflected direction of light passing through the electrodes and the reflected direction of light passing through the gap between the electrodes overlap each other, the reflectance upon display of dark state cannot be lowered, to thereby reduce the contrast ratio. Therefore, it is concluded that the contrast ratio in the reflection mode can be improved by preventing the reflected direction of light passing through the electrodes and the reflected direction of light passing through the gap between the electrodes from overlapping each other.

LC molecules disposed on the gap between the electrodes rotate on the plane of the substrate surface upon presence of applied voltage, whereas LC molecules on the electrodes do not rotate on the plane of the substrate surface upon presence of applied voltage. In view of this fact, the light passing through the gap between the electrodes is reflected in the direction toward the viewer by using the reflection film, whereas the light passing the electrodes is reflected in the direction other than the viewer by using the reflection film to improve the contrast ratio on the viewer side, which can increase the visibility. In this embodiment, the direction of the viewer side is defined as an angle within a predetermined angle range from a direction perpendicular to the substrate surface, for example, an angle range of 0 degree to 15 degrees for the incident light having an incident angle 30 degrees. As a direction other than the viewer, the direction in which light is reflected under the mirror reflection with respect to the substrate surface is considered. That is, an emitting angle of 30 degrees is considered with respect to the incident angle of 30 degrees. The direction of the mirror reflection is referred to as the specular direction hereinafter.

Figure 4:
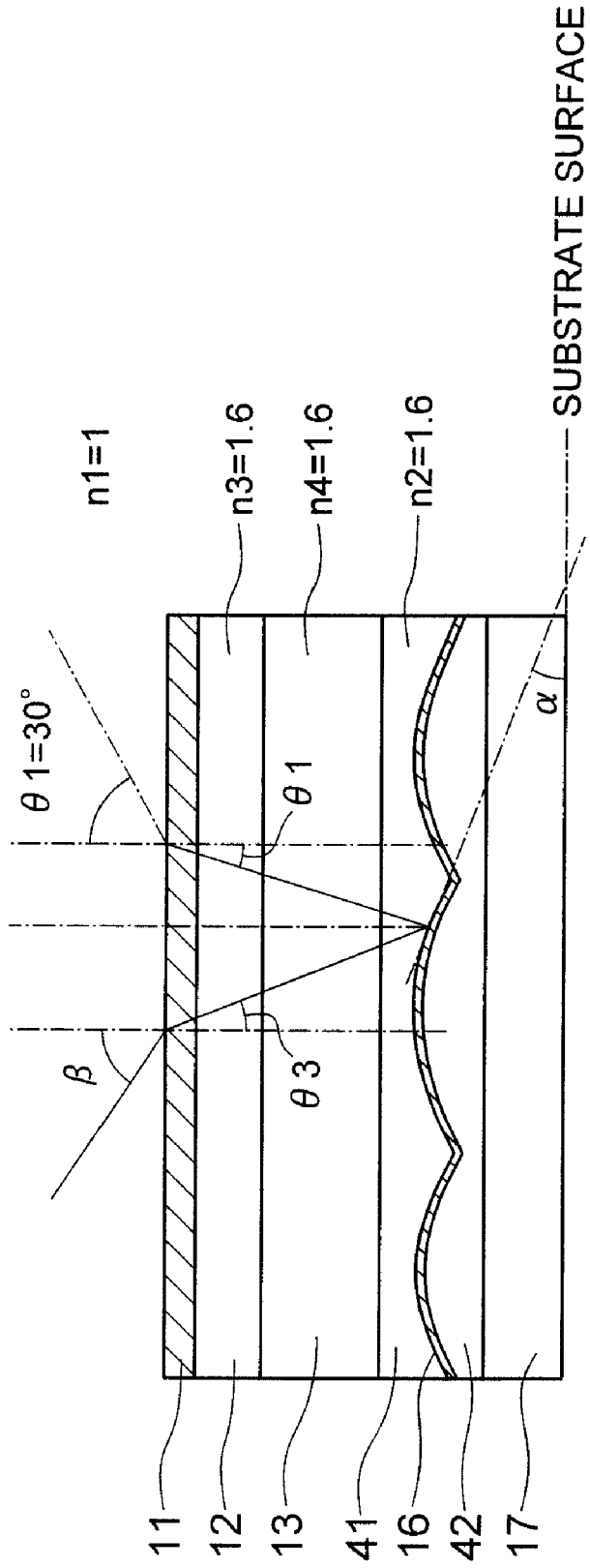
FIG. 4 is a sectional view indicative of the travelling state of light in the reflective area of the pixel in the LCD device.

FIG. 4 shows the travelling state of light in the LCD device. In general, in an LCD device provided with the reflection mode, it is considered that a viewer will observe the incident light incident on the LCD device at an incident angle of 30 degrees by recognizing the emitting light reflected at a reflection angle of approximately 0 degree to 15 degrees. The reason is that observation of light incident at an incident angle of 30 degrees by recognizing the emitting light reflected at an angle of 30 degrees or the vicinity thereof will lead to undesirable observation of reflected light source, which causes the viewer to observe the reflected light source, to feel difficulty in recognition of the displayed image. This situation is shown by a simplified structure shown in FIG. 4. Assuming that the incident angle of light is 30 degrees, the relationship between the inclination angle α of the reflection film 16 and the emitting angle β of the emitting light generated by reflection of the incident light can be approximated by the expression (4) by combining the expressions (1) to (3).

$$n1 \cdot \sin(30 \text{ degrees}) = n2 \cdot \sin\theta2 \quad (1)$$

$$\theta3 = \theta2 - 2\cdot\alpha \quad (2)$$

$$n1 \cdot \sin\beta = n2 \cdot \sin\theta3 \quad (3)$$

$$\alpha = \{\sin^{-1}[(n1/n2)\cdot\sin\beta] - \sin^{-1}[(n1/n2)\cdot\sin(30 \text{ degrees})]\}/2 \quad (4)$$

It is assumed that the refractive index of the air is n1=1.0, and the refractive index of the third insulating film 41 on the reflection film 16 is n2=1.5. In order to reflect the light incident at 30 degrees toward the range of 0 degree to 15 degrees, i.e., direction of the viewer, it is sufficient that the inclination angle of the convex-concave surface of the reflection film 16 is controlled so that the angle components in the range of 4.7 degrees to 9.1 degrees increase, by using the expression (4). In addition, in order to reflect the light incident at 30 degrees toward the range of 20 degrees to 30 degrees, i.e., in the specular reflection direction, it is sufficient that the inclination angle of the convex-concave surface of the reflection film 16 is controlled so that the angle components in the range of 0 degree to 2.9 degrees increases, by using the expression (4). For this purpose, the average inclination angle of an area of the convex-concave surface overlapping the electrodes is selected smaller than the average inclination angle of another area of the convex-concave surface overlapping the gap between the electrodes. In this structure, the light incident at 30 degrees on the electrodes is reflected by the area of the convex-concave surface toward the viewer, whereas the light incident at 30 degrees on the gap between the electrodes is reflected toward the specular reflection direction.

From expression (4), the inclination angle α of the convex-concave surface of the reflection film 16 depends on the refractive index of the third insulating film 41. Thus, it is sufficient that the inclination angle of the respective areas be designed based on the refractive index of the insulating film 41 to be used. Specifically, it is sufficient that the inclination angle of both the areas be made smaller, if the refractive index of the insulating film is smaller than 1.5. On the other hand, if the refractive index of the insulating film is larger than 1.5, the inclination angle of both the areas be made larger. In fact, the inclination angle of the convex-concave surface of the reflection film 16 changes continuously. As a method to measure the inclination angle α, there may be employed a method in which the height of the surface of the reflection film is measured using an atomic force microscope (AFM), and the absolute value of the inclination or slope between two neighboring points is approximated to the inclination angle.

Based on the above principle, the present embodiment uses a configuration wherein the incident light passing through the comb teeth electrodes, on which the LC molecules are not rotated, and reflected by the reflective film is prevented from being observed by a viewer. For this purpose, it is required that the light be intensively or collectively reflected in the specular direction in which the direction of 30 degrees is the central direction, and not reflected toward the range of angle between 0 degree and 15 degrees. In order to realize this function, the present embodiment uses a measure that the inclination angle of an area of the convex-concave surface of the reflection film overlapping the comb teeth electrodes is different from the inclination angle of another area of the convex-concave surface in the area overlapping the gap between the comb teeth electrodes. Specifically, from the above description, the average inclination angle of the first area of the convex-concave surface of the reflection film overlapping the comb teeth electrodes is set to the range of 0 degree to 2.9 degrees, to control the emitting angle of the reflected light in the specular direction. On the other hand, the average inclination angle of the second area of the convex-concave surface of the reflection film in the area overlapping the gap of the comb teeth electrodes is set to approximately 4.7 degrees to 9.1 degrees, to control the emitting angle of the reflected light within the range of 0 degree to 15 degrees, in which range the viewer observes the reflected light. The average inclination angle is obtained by averaging the inclination angles within the specified area, i.e., first area or second area. For example, there may be employed a method in which values measured and calculated by the AFM is averaged to obtain the average inclination angle. A reflection film having a convex-concave surface may be such that a plurality of convex portions are arranged in a two-dimensional array on the reflection film.

Figure 5:
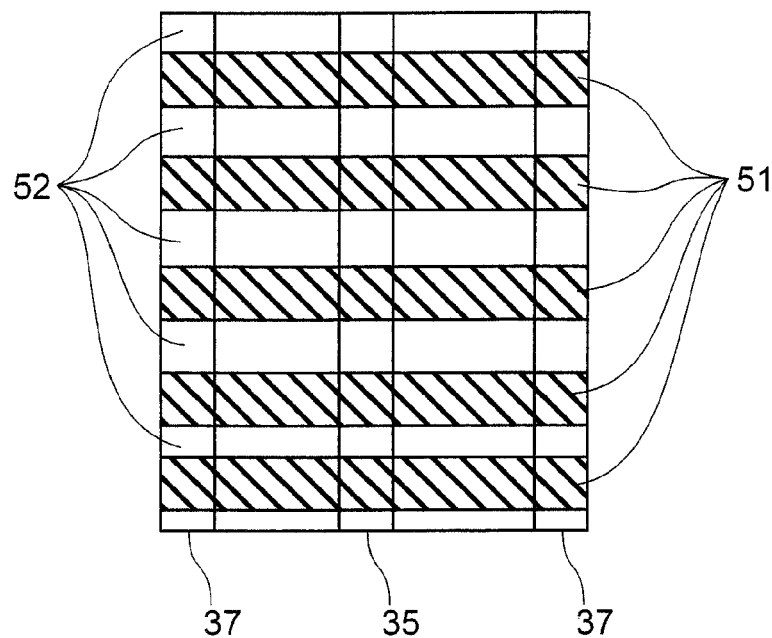
FIG. 5 is a top plan view of the pattern of a photomask used to form a convex-concave film.
Figure 6:
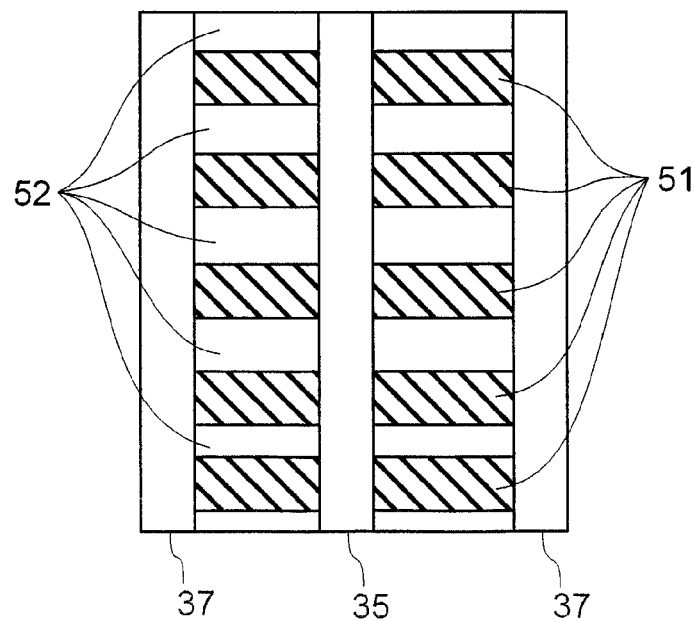
FIG. 6 is a top plan view of the pattern of another photomask used to form a convex-concave film.
Figure 7:
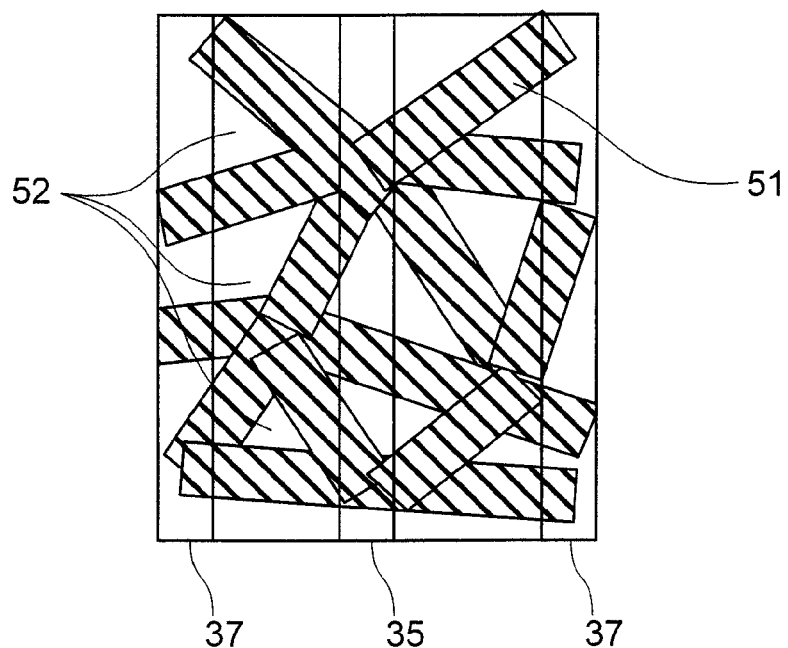
FIG. 7 is a top plan view of the pattern of another photomask used to form a convex-concave film.
Figure 8:
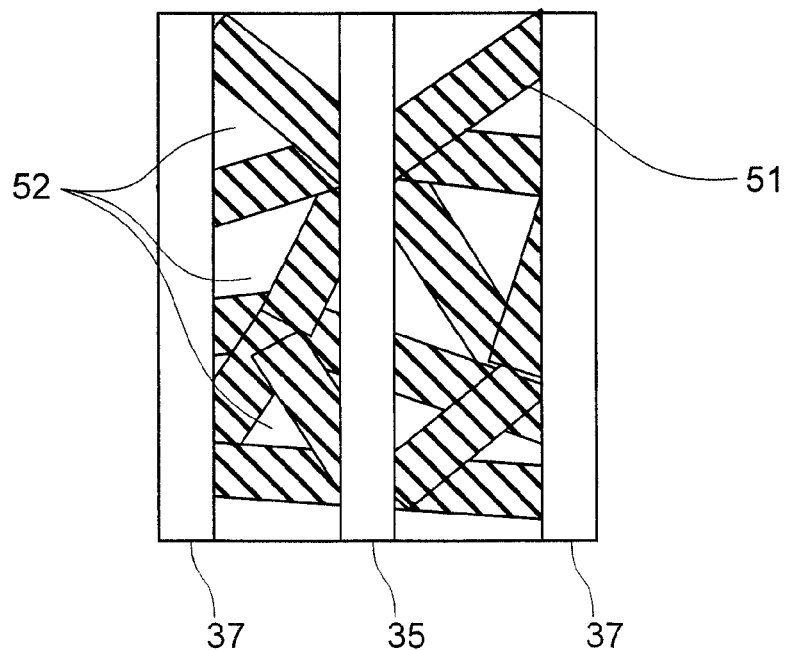
FIG. 8 is a top plan view of the pattern of another photomask used to form a convex-concave film.

For forming the inclination angle of the reflection film 16 in the area overlapping the electrodes different from that in the area overlapping the gap between the electrodes, a least number of convex portions are to be formed on the comb teeth electrodes, and the area of the reflection surface of the reflection film is separated in terms of the magnitude of the inclination angle into an area A overlapping the comb teeth electrodes and an area B overlapping the gap between the comb teeth electrode. With respect to the pattern of the convex-concave surface, the visibility was deteriorated due to the interference if a regular convex-concave surface such as corrugate pattern shown in FIG. 5 or FIG. 6 is used wherein convex portions 51 and concave portions 52 are regularly arranged. Thus, a convex-concave pattern such as shown in FIG. 7 and FIG. 8 is used wherein the extending direction of convex portions 51 is randomly changed to form triangular concave portions 52. The pattern shown in FIG. 7 is such that the convex-concave surface is formed on the area overlapping the electrodes 35, 37 as well as on the area overlapping the gap between the electrodes 35, 37, similarly to FIG. 5. The pattern shown in FIG. 8 is such that convex portions 51 are not formed on the area overlapping the electrodes 35, 37. By forming the convex-concave surface on the reflection film 16 by using the convex-concave pattern, it is studied to what extent the contrast ratio in the reflection mode and in the normally white mode is improved.

Figure 9:
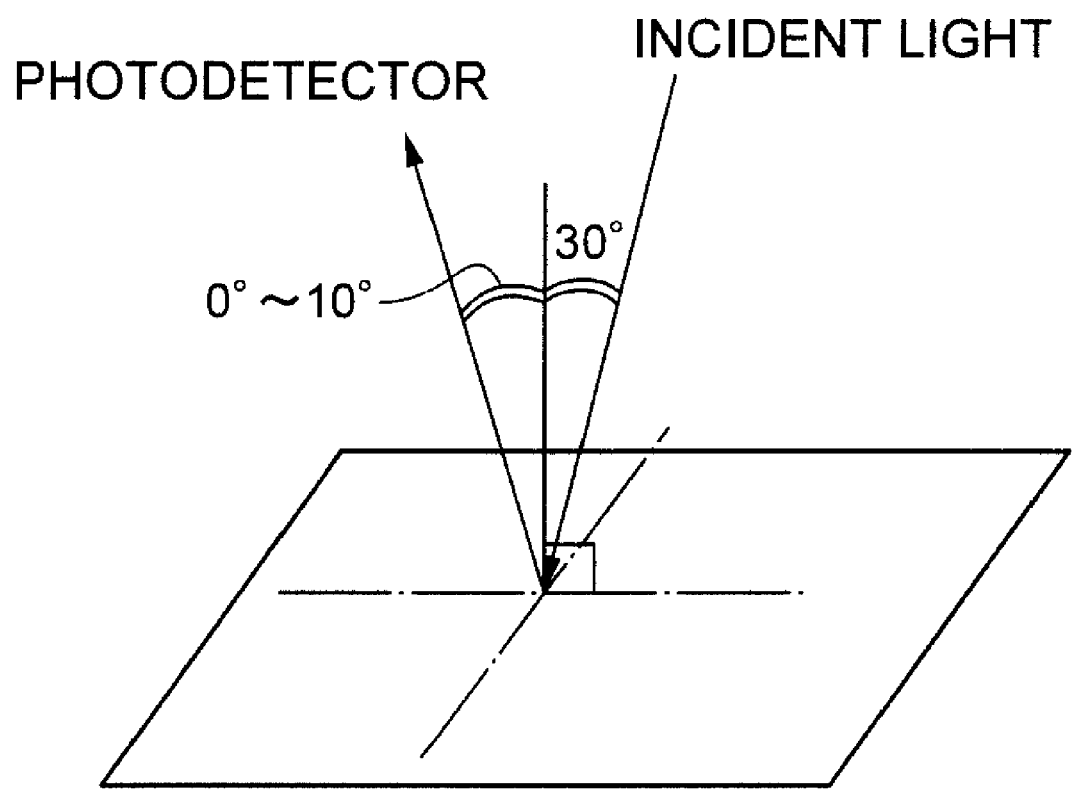
FIG. 9 is a schematic perspective view indicative of the definition for the incident direction, received angle, and specular reflection angle of light used of the evaluation of the characteristic of an LCD device.

In evaluating the leakage light, it is sufficient that the ratio of the reflectance upon display of dark state and the reflectance upon display of bright state be evaluated, or the contrast ratio be evaluated. In performing the evaluation, as shown in FIG. 9, the direction of 0 degree to 15 degrees from the perpendicular to the substrate surface is defined as the observer side and set for the light receiving angle of a photo detector. A direction of 30 degrees opposite to the light receiving angle with respect to the perpendicular to the substrate surface is set as the incident angle of the incident light. A projector is used as a light source for the incident light, which is reflected by the LCD device 10 and then measured by the photo detector for evaluation. A standard white plate (WS-3 manufactured by TOPCOM) which is formed by barium sulfate is used as the light source, and the relative reflectance is measured with the reflectance at the light receiving angle of 0 degree being 100%.

The contrast ratio is measured using an LCD device including a reflection film similar to the conventional reflection film having a convex-concave surface wherein the inclination angle is uniform between the area overlapping the electrodes and the area overlapping the gap between the electrodes. The resultant contrast ratio was approximately 5:1. On the other hand, the evaluation was also performed using a reflection film having a convex-concave surface in the area overlapping the gap between electrodes and having a uniform surface on the electrodes, wherein the inclination angle of the convex-concave surface is different between the area A and area B. The resultant contrast ratio was as high as 13:1. Thus, it was confirmed that the configuration wherein the inclination angle of the convex-concave surface is different between the area A and the area B, and wherein the light passing through the electrodes is reflected collectively to the specular reflection direction provided an improved contrast ratio and excellent visibility, due to little reflection amount into the receiving angle range of 0 to 15 degrees.

A process of manufacturing the TFT substrate 14 will be described with reference to FIGS. 10 to 17 together with sectional views taken along respective lines specified in those drawings. In these drawings, the drawings having a figure number without an alphabet are top plan views of the TFT substrate, whereas the drawings having a figure number with an alphabet are sectional views taken along line denoted by the alphabet shown in the corresponding top plan view.

Figures 10, 10A, 10B, 10C:
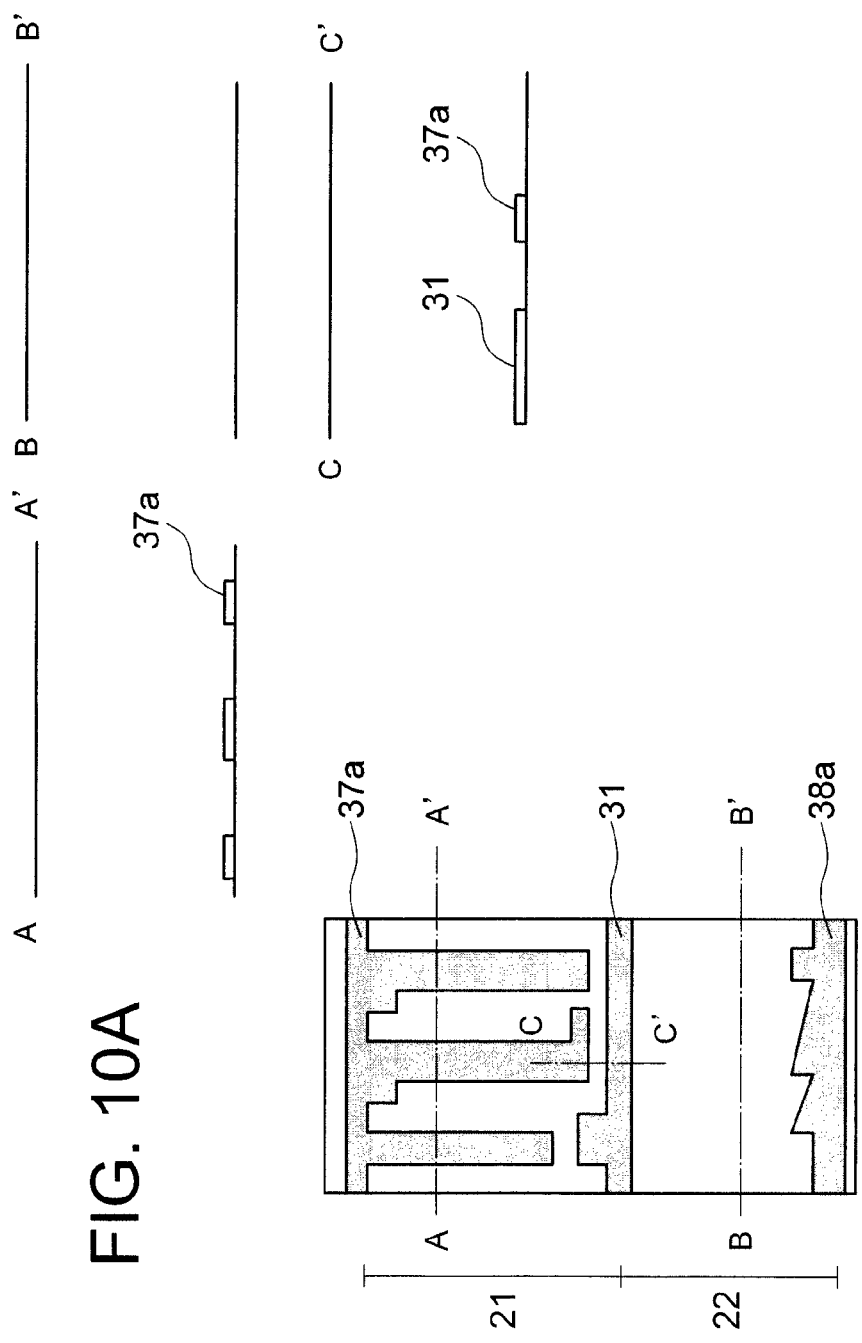
FIG. 10 is a plan view indicative of an LCD device in a step of the fabrication process for a TFT substrate.
FIG. 10A to FIG. 10C are sectional views taken along lines A-A' to C-C' in FIG. 10.

Firstly, a gate line 31, a first common electrode line 37a, and a second common electrode line 38a are formed on a transparent substrate by using a pattern shown in FIG. 10. The reflective area 21, transmissive area 22, and vicinity of the boundary between the reflective area 21 and the transmissive area 22 are shown in FIG. 10A to FIG. 10C. In order to supply a potential to the reflection film 16 in the reflection area 21, the first common electrode line 37a is so formed as to protrude in the display area. Subsequently, the gate line 31, first common electrode line 37a, and second common electrode line 38a are covered by the insulating film 17 (FIG. 1).

Next, as shown in FIG. 11, a semiconductor layer 39 to form therein the TFTs is formed. Sectional views of respective parts are shown in FIG. 11A to FIG. 11D. During forming the semiconductor layer 39, as shown in FIG. 11B, the semiconductor layer 39 is so formed as to overlap the gate line 31. Subsequently, using a pattern shown in FIG. 12, pixel electrode lines 35a, 36a to be connected to the source/drain of the TFTs are formed. At this step, the reflective area 21, transmissive area 22, and vicinity of the boundary between the reflective area 21 and the transmissive area 22 are also shown.

In the reflective area 21, the first common electrode line 37a is formed between adjacent pixel electrode lines 35a. At this step, the first common electrode line 37a is formed such that the area ratio between the pixel electrode line 35a and the first common electrode line 37a assumes 1:1 in the display area. This is for the purpose of supplying the intermediate potential between the pixel electrode 35 and the common electrode 37 to the reflection film 16, to be formed later, during displaying an image. After forming the first common electrode line 37a and second common electrode line 38a, the insulating film 17 is formed thereon.

Thereafter, a convex-concave overcoat (OC) film 42 is formed, as a second insulating film, as shown in FIG. 13. As shown in FIG. 13A to FIG. 13D, the convex-concave OC film 42 is so formed as to have convex-concave surface wherein a plurality of convex portions are formed to define the convex portions and concave portions. In this step, photosensitive resin is coated on the substrate, and the photosensitive resin is exposed to light by using a photomask formed by using the mask pattern such as shown in FIG. 5, an exposed portion of the photosensitive resin is removed by development, and the developed photosensitive resin is subjected to a burning treatment to form the convex-concave OC film 42. In the thus formed convex-concave OC film 42, the inclination angle has different components between the area A corresponding to the electrodes 35, 37 and the area B corresponding to the gap between adjacent two of the electrodes 35, 37. An Al layer is then formed on the thus formed convex-concave OC film 42, and patterned to form the reflection film 16 in the reflective area 21 by using a pattern shown in FIG. 14. The resultant reflection film 16 has a convex-concave surface which reflects the convex-concave surface of the underlying convex-concave OC film 42. The reflective area 21, transmissive area 22, and vicinity of the boundary between the reflective area 21 and the transmissive area 22 are also shown in FIG. 14A to FIG. 14D.

Figure 16E:
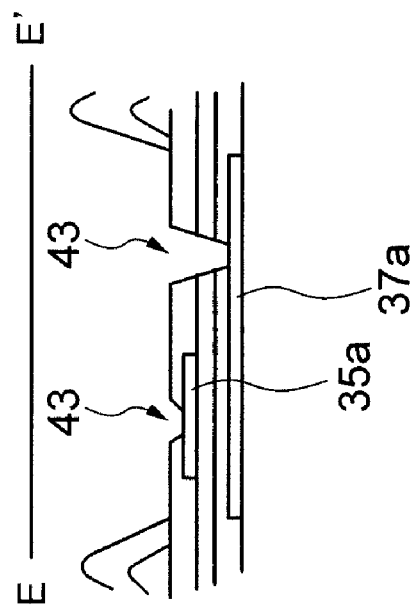
FIG. 16 and FIG. 16E show a subsequent step subsequent to the step of FIG. 15 and FIGS. 15A to 15C, showing the subsequent step similarly thereto.
Figure 16:
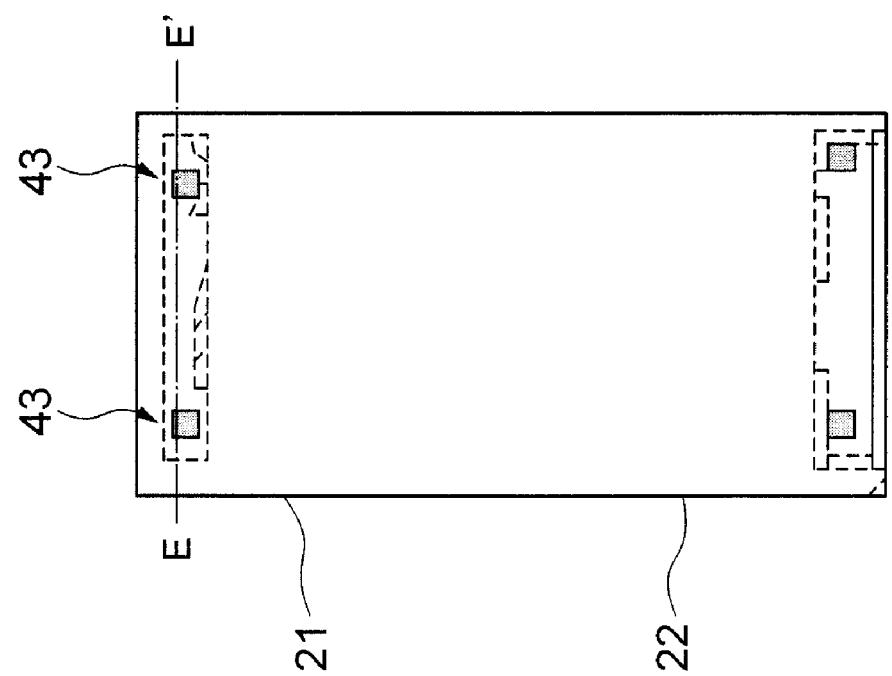

After forming the reflection film 16, a planarization OC layer 41 is formed as a third insulating film by using a pattern shown in FIG. 15. The planarization OC layer 41 provides a step difference in the vicinity of the boundary between the reflective area 21 and the transmissive area 22, as shown in FIG. 15A to FIG. 15D. The planarization OC layer 41 adjusts the cell gap between both the areas. Thereafter, contact holes 43 are formed in the insulating film 17 covering the pixel electrode lines 35a, 36a and common electrode lines 37a, 38a, as shown in FIG. 16, whereby pixel electrode lines 35a, 36a and common electrode lines 37a, 38a are exposed, as shown in FIG. 16E.

After forming the contact holes 43, the pixel electrodes 35, 36 and common electrodes 37, 38 are formed on the planarization OC layer 41, by using a pattern shown in FIG. 17. The reflective area 21, transmissive area 22, and vicinity of the boundary between the reflective area 21 and the transmissive area 22 are shown in FIG. 17A to FIG. 17C. In the step of forming the pixel electrodes 35, 36 and common electrodes 37, 38, the respective electrodes, pixel electrode lines 35a, 36a, and common electrode lines 37a, 38a are connected together via the contact holes. By using the above process, the TFT substrate 14 to be used in a transflective type LCD device 10 in this embodiment is produced.

Next, the advantages of the above embodiment will be described. In the embodiment, the inclination angle of the convex-concave surface of the reflection film 16 overlapping the electrodes is different from that overlapping the gap between the electrodes in the LCD device 10 of the lateral-electric-field drive mode and including the reflection mode of the normally white mode. By suitably setting the inclination angle in an area corresponding to the electrodes and the inclination angle in an area corresponding to the gap between the electrodes, the light which passes through the gap between the electrodes and reflected by the convex-concave surface of the reflection film is emitted in the range of the received angle of 0 degree to 15 degrees for the photo detector, and light which passes the electrodes, where LC molecules are not rotated, are reflected toward the specular reflection direction range having a center at the direction of 30 degrees from the perpendicular. The prevention of light passing through the electrodes from emitting in the received range of 0 degree to 15 degrees improves the contrast ratio as compared to the case where the inclination is uniform between the electrodes and the gap between the electrodes, to thereby improve the visibility.

Figure 19A:
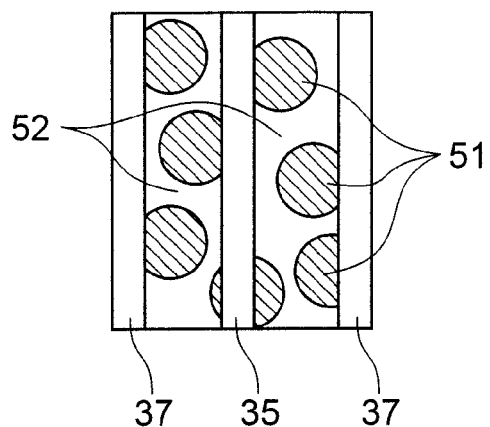
FIGS. 19A and 19B each are a top plan view of the pattern of a photomask used to form a convex-concave film by using a circle pattern.

In the above embodiment, the pattern shown in FIG. 7 or FIG. 8 is used for forming a triangular pattern on the convex-concave OC film. However, in an alternative, as shown in FIGS. 18A and 18B, a pattern may be used in which sides of polygons other than triangles correspond to convex portions 51 (FIG. 18B) or concave portions 52 (FIG. 18A). Furthermore, a pattern using circles shown in FIGS. 19A and 19B and a pattern using ellipses shown in FIGS. 20A and 20B may be employed. When employing these patterns, areas encircled by the circles or ellipses may correspond to convex portions

Figure 19B:
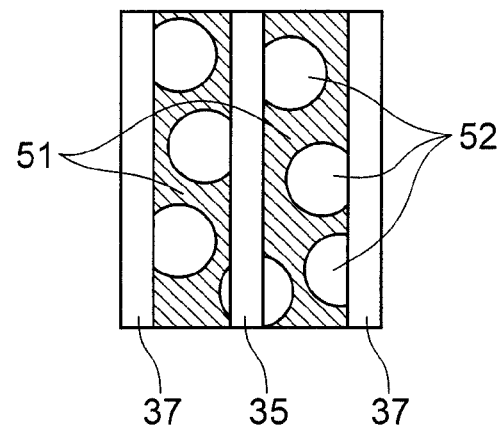
Figure 20A:
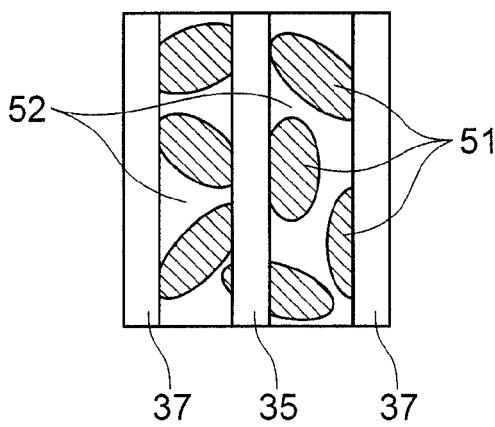
FIGS. 20A and 20B each are a top plan view of the pattern of a photomask used to form a convex-concave film using an ellipse pattern.
Figure 20B:
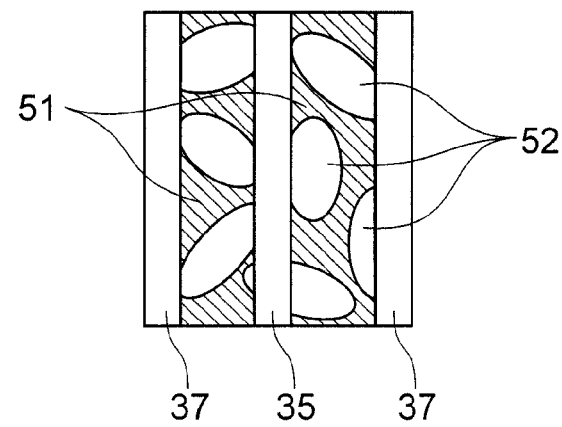
Figure 21:
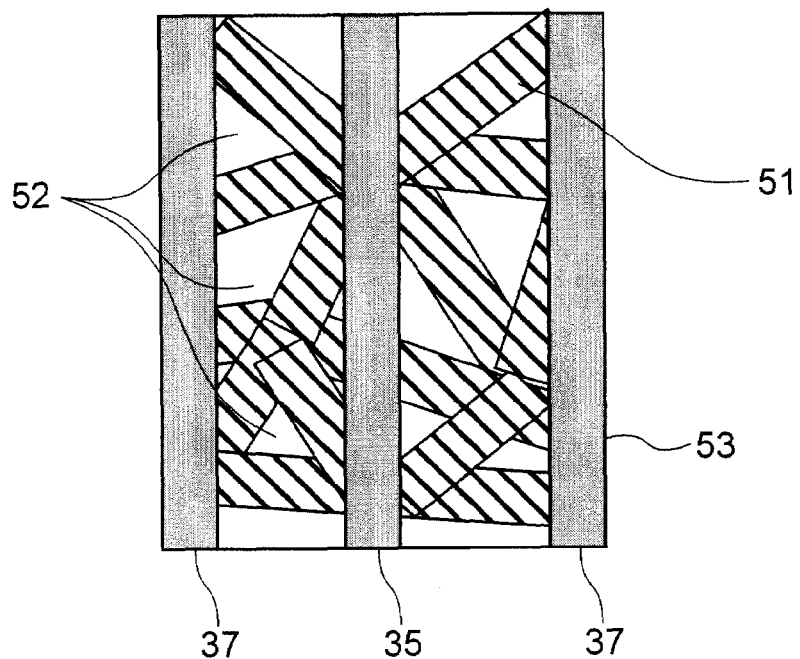
FIG. 21 is a top plan view of the pattern of a photomask used to form a convex-concave film by using a light shielding pattern.

51 (FIGS. 19A and 20A), or areas encircled by the circles or ellipses and may to correspond to concave portions 52 (FIGS. 19B and 20B). Furthermore, a combination pattern including a plurality of these patterns may be employed to configure the convex-concave surface of the reflection film 16. Moreover, patterns other than these patterns may be employed so long as the patterns can obtain desired reflection characteristics, in which the convex-concave surface is provided in an area overlapping the gap between the electrodes 35, 37, and the convex-concave surface is not provided in an area overlapping the electrodes 35, 37. Moreover, in the above description, a photomask that forms the convex-concave pattern is used for removing the pattern from the portion corresponding to the electrodes. However, as shown in FIG. 21, a photomask which has a light shielding pattern 53 on the portion corresponding to the electrodes 35, 37 may be employed as well to lower the inclination angle.

Next, a second embodiment will be described. This embodiment is similar to the first embodiment except that the display mode is the normally black mode in the present embodiment. Also in this embodiment, it is studied that the convex-concave surface is scarcely formed to overlap the comb teeth electrodes, and the inclination angle of the convex-concave reflection film is different between the area A overlapping the electrodes and the area B overlapping the gap between the electrodes. The pattern used in the present embodiment is similar to that in the first embodiment. That is, the convex-concave pattern shown in FIG. 7 and FIG. 8 in which sides of randomly arranged triangles configure the convex portions.

By using different the inclination angles of the convex-concave surface of the reflection film between the area A and area B, it was investigated how the reflectance in the reflection mode is changed in the case of the normally block mode. The result is shown in the table 1 as listed below. In this table 1, the average inclination angle is calculated for the part where the portion corresponding to the electrodes is subjected to planarization and the part where the portion corresponding to the electrodes is subjected to planarization. In case of the same average inclination angle, planarization of the part corresponding to the electrodes provides a higher reflectance. This indicates that the formation of the convex-concave surface increases the light components of the inclination angle reflected on the gap between the electrodes to contribute a bright image, that is, components in the range of 5 degrees to 9 degrees. The increase is obtained by disposing the convex portions having a higher inclination angle on the electrodes with a higher density.

TABLE 1

Average inclination angle and relative reflectance

| | Relative Reflectance on Light Receiving Angle of 10 degrees | | |
|---|---|---|---|
| Average Inclination Angle (deg.) | 6 | 7.5 | 9 |
| Planarization Ratio on Electrodes (%) | 14.8 | 19.3 | 13.4 |
| Ratio of Convex-Concave Portion (%) | 13.3 | 15.6 | 7.9 |

From the above-described results, it is also confirmed in this embodiment of the normally black mode that planarization of the convex-concave OC film in the area overlapping the electrodes improves the luminance of the bright state. In addition, it is also confirmed that the bright state image provided by absence of applied voltage can neglect the influence by the planarization of the reflection film in the area overlapping the electrodes. This fact means that the improvement of the reflectance upon display of bright state improves the contrast ratio and achieves a higher contrast ratio.

Next, a third embodiment will be described. In the first and second embodiments, a higher contrast ratio is obtained by removing the convex-concave surface of the reflection film overlapping the electrodes. On the other hand, in this embodiment, the inclination angle of the convex-concave surface of the reflection film is reduced in the area overlapping the electrodes by arranging patterns in the form of dots in the area overlapping the gap between the electrodes. In addition, patterns in the form of dots, which are smaller than the dots formed in the area overlapping the gap between the electrodes, are provided in the area overlapping the electrodes. Those configurations provide a smaller inclination angle of the convex-concave surface of the reflection film in the area overlapping the electrodes. Other configurations are similar to those in the first and second embodiments.

Figure 22:
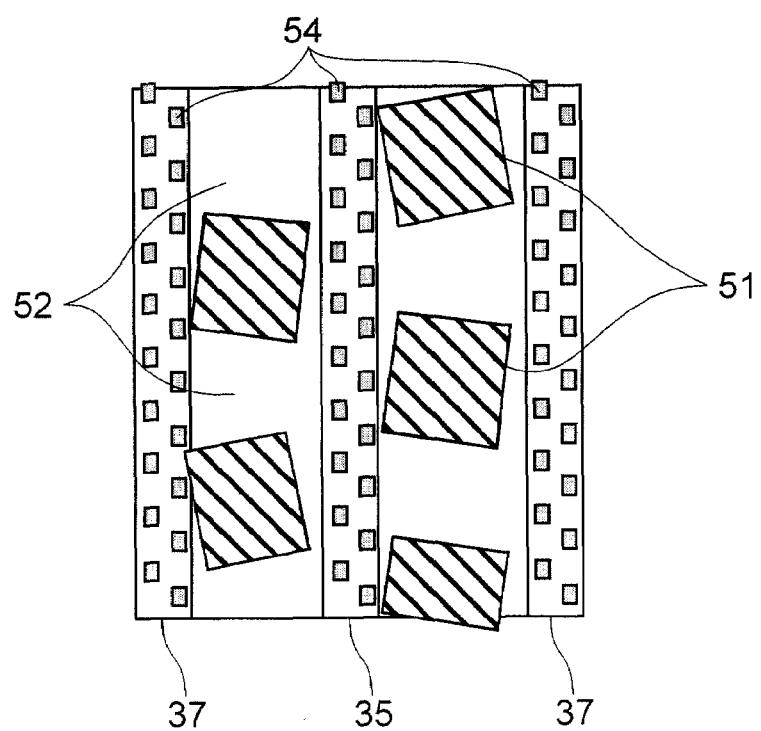
FIG. 22 is a top plan view indicative of the pattern used in forming a convex-concave film in the third embodiment.

FIG. 22 shows a pattern of convex-concave surface of the reflection film. This pattern is such that rectangular dot patterns are provided in the area overlapping the gap between the electrodes 35, 37, and a gray-tone film 54 including rectangular dot patterns having a smaller size are also provided in the area overlapping the electrodes 35, 37. In this figure, the rectangular dot patterns may be replaced by dot patterns having different shape, such as circular dot patterns, elliptical dot patterns or polygonal dot patterns. These dot patterns allow the portion of the convex-concave surface to be more planarized on the electrode.

Figure 23:
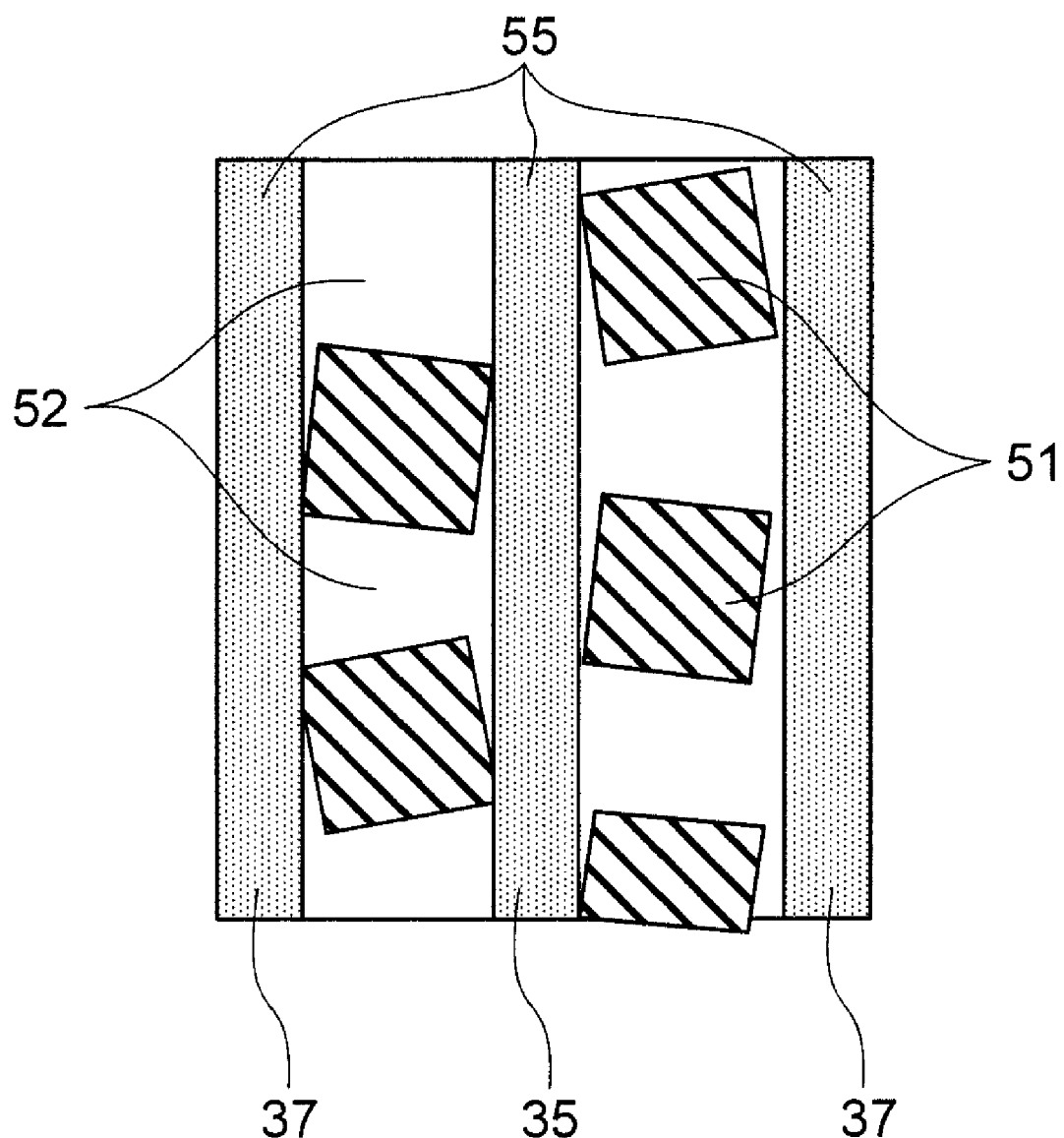
FIG. 23 is a top plan view indicative of another example of the pattern used in forming a convex-concave film.

Formation of the convex-concave surface of the reflection film by using the patterns shown in FIG. 22 reduces the inclination angle, which is formed between the planarized portion of the reflection film overlapping the electrodes and other peripheral portion and thus extend parallel to the electrodes, as compared with the case of using patterns which remove convex-concave surface in the area overlapping the electrodes. Thus, the reflectance and the contrast ratio are not reduced with respect to the angle range of 0 degree to 15 degrees, and the light incident from the other angle range is not scattered to achieve an excellent visibility. In FIG. 22, small dot patterns are arranged on the portion corresponding to the electrodes 35, 37. However, a half-tone mask using a semi-transmissive film may be used instead, as shown in FIG. 23.

Figure 24:
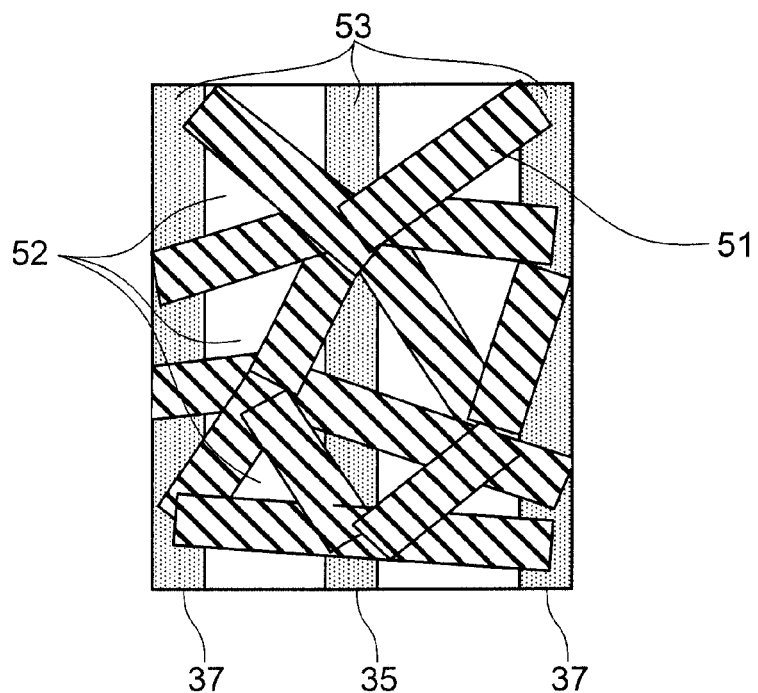
FIG. 24 is a plan view indicative of the pattern used in forming a convex-concave film in the fourth embodiment.

Next, a fourth embodiment will be described. FIG. 24 shows a pattern used for forming a convex-concave surface on the reflection film in this embodiment. Other configurations are similar to those in the above embodiments. In this embodiment, a half-tone mask 55 is provided on at least the portion corresponding to the electrodes 35, 37. In this configuration, the half-tone mask 55 formed only in the area overlapping the electrodes 35, 37 and combined with the conventional convex-concave surface of the reflection film reduces the amount of exposure light on the convex-concave surface overlapping the electrodes 35, 37 compared to the convex-concave surface overlapping the gap between the electrodes. This reduces the average inclination angle in the area overlapping the electrodes, whereby the light passed by the electrodes can be reflected into the specular reflection direction, thereby improving the contrast ratio.

As described heretofore, in the respective embodiments of the present invention, inclination angle of the reflection film is different between the area corresponding to the electrodes and the area corresponding to the gap between the electrodes, whereby the light passed by the electrodes, on which the LC molecules are not rotated, is reflected toward the specular reflection direction and the vicinity thereof. This improves the contrast ratio up to a higher value of 13:1 or more as compared to the case of conventional normal white mode achieving a contrast ratio of around 3:1 at the maximum. In addition, in the case of normal black mode, as shown in Table 1, a maximum of 70% reflectance can be achieved for the same average inclination angle (9 degrees), and also a 23% reflectance improvement can be achieved at the average inclination angle of 7.5 degrees at which the reflectance assumes a maximum, and also the contrast ratio can be improved.

While the invention has been particularly shown and described with reference to exemplary embodiment and modifications thereof, the invention is not limited to these embodiment and modifications. It will be understood by those of ordinary skill in the art that various changes in form and details may be made therein without departing from the spirit and scope of the present invention as defined in the claims.

What is claimed is:

1. A liquid crystal display (LCD) device comprising:
   a reflection area for reflecting incident light and provided in at least a part of a pixel;
   a reflection film provided in said reflection area and having a convex-concave surface; and
   a plurality of electrodes for driving therebetween liquid crystal (LC) molecules in a lateral direction, wherein:
   an inclination angle of said convex-concave surface has different components between a first area overlapping said electrodes and a second area overlapping a gap between adjacent two of said electrodes.

2. The LCD device according to claim 1, wherein components of said inclination angle in said first area have a lower-angle distribution than components of said inclination angle in said second area.

3. The LCD device according to claim 1, wherein said inclination angle of said reflection film is such that light reflected by said second area is emitted toward an observer, and light reflected by said first area is emitted toward a specular reflection direction.

4. The LCD device according to claim 1, wherein components of said inclination angle in said second area are such that components residing in a range of 4.7 to 9.1 degrees are larger in amount than components residing in a range of 0 to 2.9 degrees, and wherein components of said inclination angle in said first area are such that components residing in a range of 0 to 2.9 degrees are larger in amount than components residing in a range of 4.7 to 9.1 degrees.

* * * * *